(12) United States Patent
Ichiriu et al.

(10) Patent No.: US 7,043,673 B1
(45) Date of Patent: May 9, 2006

(54) CONTENT ADDRESSABLE MEMORY WITH PRIORITY-BIASED ERROR DETECTION SEQUENCING

(75) Inventors: Michael E. Ichiriu, Cupertino, CA (US); Varadarajan Srinivasan, Los Altos Hills, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 395 days.

(21) Appl. No.: 10/002,713

(22) Filed: Nov. 1, 2001

Related U.S. Application Data

(63) Continuation-in-part of application No. 09/922,423, filed on Aug. 3, 2001.

(51) Int. Cl.
*G11C 29/00* (2006.01)

(52) U.S. Cl. ..................................... 714/719
(58) Field of Classification Search ............... 714/718, 714/719, 724, 733, 48; 365/49, 200, 201; 711/108
See application file for complete search history.

(56) References Cited

U.S. PATENT DOCUMENTS

| | | | |
|---|---|---|---|
| 4,112,502 A | 9/1978 | Scheuneman | |
| 4,747,080 A | 5/1988 | Yamada | |
| 5,107,501 A | 4/1992 | Zorian | |
| 5,450,424 A | 9/1995 | Okugaki et al. | |
| 5,455,834 A | 10/1995 | Chang et al. | |
| 5,491,703 A | 2/1996 | Barnaby et al. | |
| 5,796,758 A | 8/1998 | Levitan | |
| 5,872,802 A | 2/1999 | Knaack et al. | |
| 5,999,450 A | 12/1999 | Dallabora et al. | |
| 6,014,755 A | 1/2000 | Wells et al. | |
| 6,067,262 A | 5/2000 | Irrinki et al. | |
| 6,067,656 A | 5/2000 | Rusu et al. | |
| 6,085,334 A * | 7/2000 | Giles et al. ................... | 714/7 |
| 6,137,707 A | 10/2000 | Srinivasan et al. | |
| 6,154,384 A | 11/2000 | Nataraj et al. | |
| 6,199,140 B1 | 3/2001 | Srinivasan et al. | |
| 6,243,281 B1 | 6/2001 | Pereira | |
| 6,324,087 B1 | 11/2001 | Pereira | |
| 6,381,673 B1 | 4/2002 | Srinivasan et al. | |
| 6,542,391 B1 | 4/2003 | Pereira et al. | |
| 6,560,156 B1 | 5/2003 | Lien et al. | |
| 6,564,344 B1 | 5/2003 | Bui et al. | |
| 6,625,766 B1 * | 9/2003 | Oh et al. ................... | 714/719 |
| 6,657,878 B1 | 12/2003 | Lien et al. | |
| 6,690,595 B1 | 2/2004 | Srinivasan et al. | |
| 6,700,827 B1 | 3/2004 | Lien et al. | |

(Continued)

OTHER PUBLICATIONS

"Error Correction with Hamming Codes," pp. 1-2 downloaded Jun. 22, 2001 from URL http://www.rad.com/networks/1994/err_con/hamming.htm.

(Continued)

*Primary Examiner*—Guy Lamarre
*Assistant Examiner*—James C. Kerveros
(74) *Attorney, Agent, or Firm*—Shemwell Mahamed LLP

(57) ABSTRACT

A content addressable memory (CAM) device having circuitry to generate a biased sequence of addresses. A first counter circuit increments an address value in response to a clock signal and resets the address value to a start address in response to a control signal. A second counter increments a limit value in response to a control signal. A compare circuit compares the address value and the limit value and, if the address value and the limit value have a predetermined relationship, asserts the control signal.

48 Claims, 21 Drawing Sheets

U.S. PATENT DOCUMENTS

| | | |
|---|---|---|
| 2002/0083421 A1 | 6/2002 | Simons |
| 2002/0120887 A1 | 8/2002 | Hughes et al. |
| 2003/0074630 A1 | 4/2003 | Batson et al. |
| 2003/0161194 A1 | 8/2003 | Ma et al. |

OTHER PUBLICATIONS

"Motorola Fast and LS TTL Data," pp 5-131, 132, Motorola Inc., 1986.

* cited by examiner

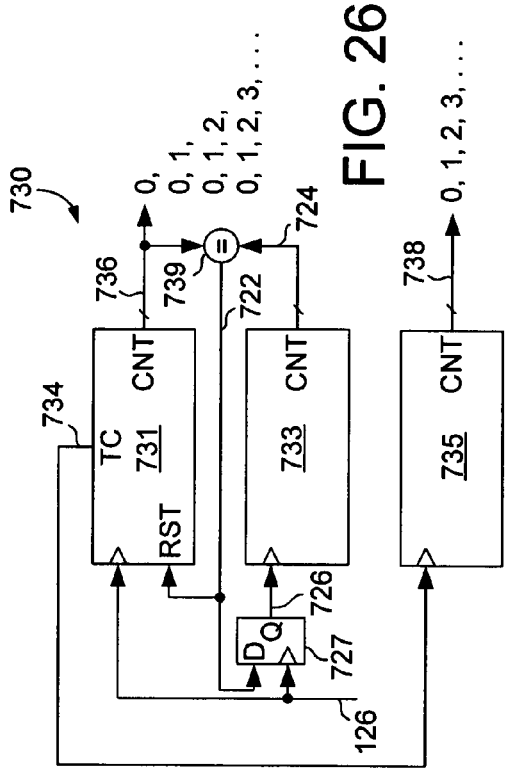
FIG. 23
FIG. 24
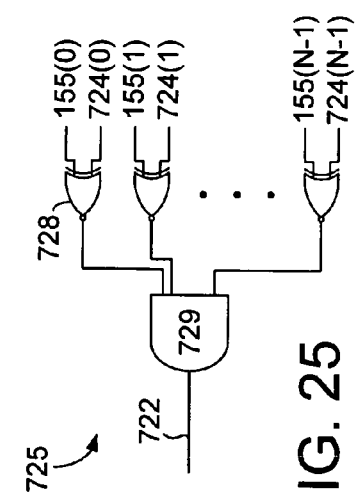
FIG. 25
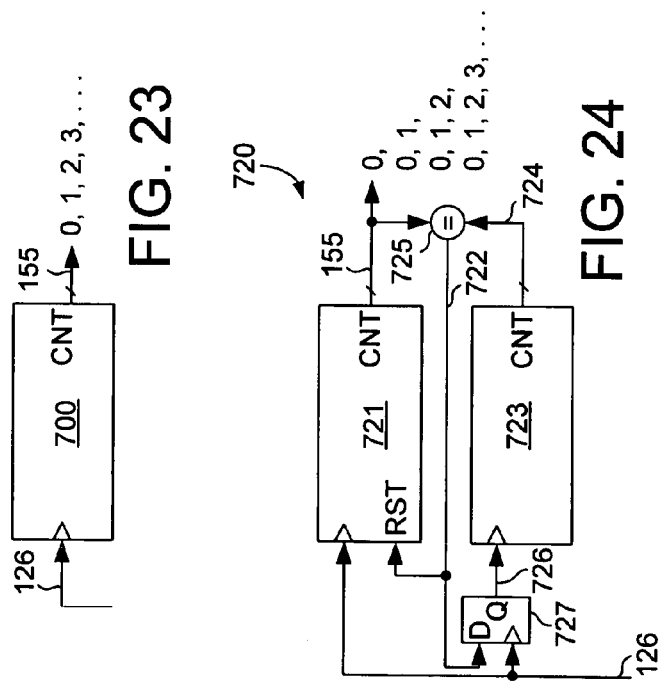
FIG. 26
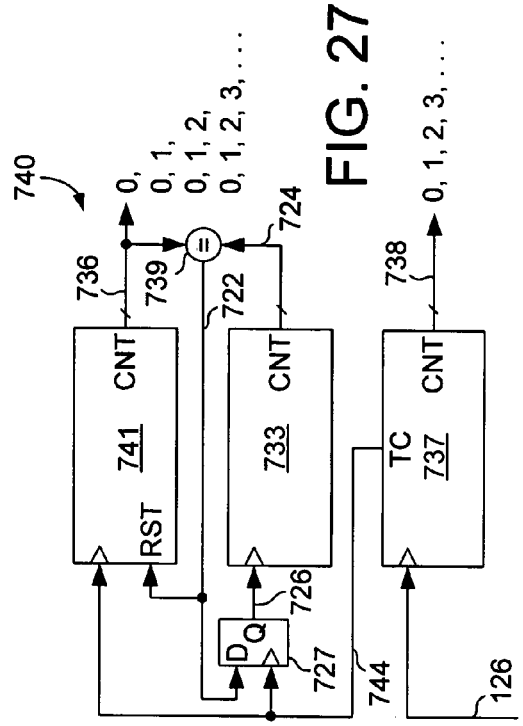
FIG. 27

CONTENT ADDRESSABLE MEMORY WITH PRIORITY-BIASED ERROR DETECTION SEQUENCING

CROSS-REFERENCE TO RELATED APPLICATIONS

This application is a continuation-in-part of U.S. patent application Ser. No. 09/922,423, filed Aug. 3, 2001. U.S. patent application Ser. No. 09/922,423 is hereby incorporated by reference in its entirety.

FIELD OF THE INVENTION

The present invention relates generally to content addressable memory devices, and more particularly to error detection within content addressable memory devices.

BACKGROUND

Content addressable memory (CAM) devices are often used in network switching and routing applications to determine forwarding destinations for data packets. A CAM device can be instructed to compare a selected portion of an incoming packet, typically a destination field within the packet header, with data values, called CAM words, stored in an associative storage array within the CAM device. If the destination field matches a CAM word, the CAM device records a CAM index that identifies the location of the matching CAM word within the storage array, and asserts a match flag to signal the match. The CAM index is then typically used to index another storage array, either within or separate from the CAM device, to retrieve a destination address or other routing information for the packet.

Any corruption of CAM words stored within a CAM device (e.g., due to alpha particle bombardment or failure of a storage cell within the CAM device) may result in a false match/non-match determination and ultimately in non-delivery of packets or delivery of packets to an incorrect destination. While it is known to store parity information in the CAM device for error detection purposes, the parity information is generally used to detect errors only when a host device instructs the CAM device to perform a read operation (i.e., output a CAM word). That is, parity checking is not performed during a typical compare operation because the CAM word is usually not read during such an operation. Moreover, any interruption of the normal operation of the CAM device, for example to read CAM words for error detection purposes, reduces the number of timing cycles available for compare operations, effectively lowering the compare bandwidth of the CAM device.

SUMMARY

A content addressable memory (CAM) device having a CAM storage array and circuitry to detect errors in the CAM storage array is disclosed in numerous embodiments. In at least one embodiment, the CAM device includes circuitry to identify errors in the CAM storage array concurrently with performing host-requested compare operations, thereby providing an error checking function without reducing the compare bandwidth of the CAM device. Further embodiments include circuitry to log errors and error addresses in an error address register for subsequent host inspection, and circuitry to automatically invalidate or correct an entry in the CAM storage array upon detecting an error. Also, embodiments for generating a biased sequence of error check addresses are disclosed. These and other features and advantages of the present invention are described in the detailed description below.

BRIEF DESCRIPTION OF THE DRAWINGS

The present invention is illustrated by way of example, and not by way of limitation, in the figures of the accompanying drawings and in which like reference numerals refer to similar elements and in which:

FIG. 23 illustrates a counter that may be used to generate a linear sequence of error check addresses within a CAM device;

FIG. 24 illustrates an embodiment of an address generator for generating an error scan sequence that is biased toward lower ordered address values;

FIG. 25 illustrates an embodiment of the compare circuit of FIG. 24;

FIG. 26 illustrates an address generator that may be used to generate a biased sequence of row addresses and a linear sequence of block addresses;

FIG. 27 illustrates an alternate embodiment of an address generator for generating a biased sequence of row addresses and a linear sequence of block addresses;

DETAILED DESCRIPTION

CAM Device

Figure 1:
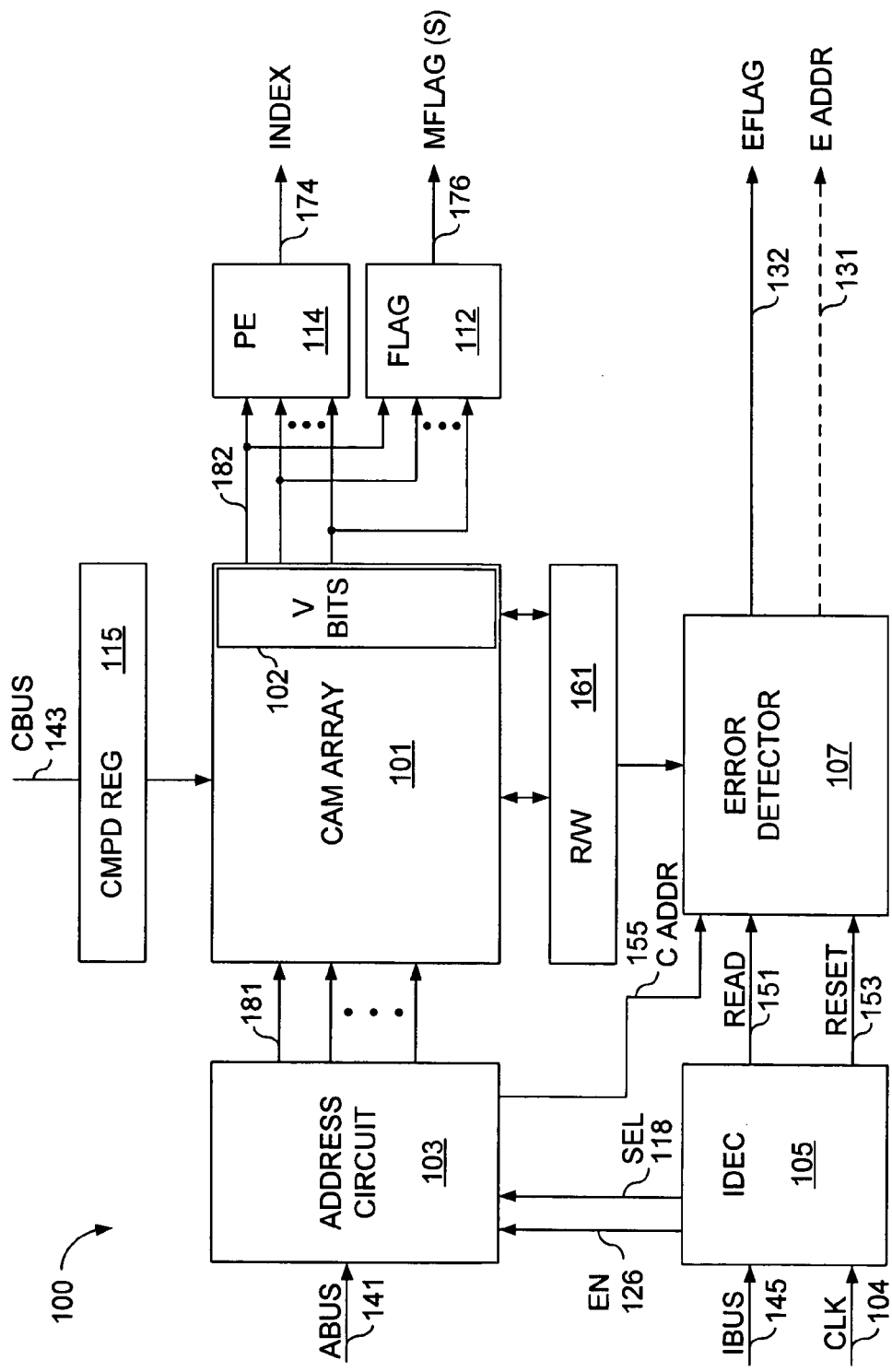
FIG. 1 illustrates a CAM device according to an embodiment of the present invention.

FIG. 1 illustrates a CAM device 100 according to an embodiment of the present invention. The CAM device includes a CAM array 101, address circuit 103, instruction decoder 105, error detector 107, flag circuit 112, priority encoder 114, comparand register 115 and read/write circuit 161. Instructions, addresses and commands are input to the CAM device via an instruction bus (IBUS) 145, address bus (ABUS) 141 and comparand bus (CBUS) 143, respectively. Each of the buses is preferably a multi-conductor signal path coupled to at least one host device, such as a general purpose processor, digital signal processor, network processor, application specific integrated circuit (ASIC) or other instruction issuing device. Also, in alternative embodiments, one or more of the buses may be eliminated and the corresponding signals time-multiplexed onto another of the buses.

The CAM array 101 includes a plurality of CAM cells arranged in rows for storing CAM words. The CAM array also includes a validity storage 102 to store validity values. Each validity value corresponds to a respective row of CAM cells and indicates whether the row contains a valid CAM word. As discussed below, each validity value may be represented by a single bit or multiple bits. The CAM array 101 is coupled to (i.e., connected directly to or through one or more intervening circuits) the address circuit 103, priority encoder 114, flag circuit 112, comparand register 115, and read/write circuit 161. The address circuit 103 is used to select a particular row of the CAM array for read or write access. The read/write circuit 161 is used to sense the output of the selected row during a read operation and to transmit a value to the selected row during a write operation. The comparand register 115 is used to store a comparand value received via the comparand bus 143, and outputs the comparand value to the CAM array 101. In alternative embodiments the comparand register 115 may be omitted and the comparand value input directly to the CAM array 101 from the comparand bus 143. During a compare operation, the comparand may be masked by a global mask value, then compared simultaneously with all the CAM words stored in the CAM array 101. Each of the rows of CAM cells is coupled to a corresponding match line 182, and any match between the comparand and a valid CAM word results in a match signal being output to the priority encoder 114 and flag circuit 112 via the corresponding match line 182. When one or more match signals are asserted on the match lines 182, the priority encoder 114 selects one of the match signals and outputs a CAM index 174 (i.e., address of the CAM word corresponding to the selected match signal). The flag circuit 112 also receives the match signals, and outputs a match flag signal to indicate that a match has occurred. If more than one match signal is asserted, the flag circuit may additionally output a multiple match flag signal to indicate that multiple matches have occurred.

As described below in greater detail, the CAM array 101 is preferably structured to permit read and compare operations to be executed concurrently (i.e., at least partly overlapping in time). Consequently, the CAM array may be read for error checking purposes even when host-requested compare operations are being performed. This provides significant advantages over the prior art error checking technique described above because error checking can effectively be performed in the background, with little or no consumption of compare bandwidth. Moreover, the prior art error checking occurs as part of a host-requested read, meaning that only those CAM array locations selected to be read by the host are error checked. Unless the host is programmed to systematically read all the locations in the CAM array, it is likely that numerous CAM array locations will not be checked. By contrast, in embodiments of the present invention, error checking is performed systematically using an address generator within address circuit 103 to generate a predetermined sequence of error check addresses, thus ensuring that all locations within the CAM array are checked.

Still referring to FIG. 1, the address circuit 103 is used to access the CAM array during read and write operations. Address values (received, for example, via the address bus 141 or from address sources within the CAM device) are decoded to activate corresponding word lines 181. Each word line is coupled to a respective row of CAM cells within the CAM array 101 and enables a CAM word to be output from or input to the array. The instruction decoder 105 outputs a select signal 118 to select the address source used to access the CAM array 101. The instruction decoder also outputs an enable signal 126 to the address circuit 103. The enable signal 126 is used to control generation of error check addresses by a check address generator within the address circuit 103. In one embodiment, the address circuit 103 outputs each check address to the error detector 107.

All instructions to the CAM device, including instructions to load other registers are first received in the instruction decoder 105 via the instruction bus 145. The instruction decoder 105 includes circuitry to decode the incoming instructions as well as control circuitry that responds to the decoded instructions by issuing control and timing signals to other circuit blocks within the CAM device 100. In one embodiment, the instruction decoder 105 is a state machine that transitions from state to state in response to transitions of a clock signal 104 (CLK) and according to status signals received from other circuit blocks within the CAM device 100 and instructions received from the decode circuit 106. For another embodiment, the instruction decoder 105 is a lookup table or read only memory (ROM). The instruction decoder 105 may further include delay circuitry to delay output of timing and control signals to other circuit blocks within the CAM device 100 until appropriate times within a given cycle of the clock signal 104.

The error detector 107 is used to detect errors in CAM words output from the CAM array in error checking operations. The error detector 107 is coupled to receive a CAM word and corresponding validity value from the read/write circuit 161 and to receive the control signals RESET 153 and READ 151 from the instruction decoder 105. Upon detecting an error, the error detector 107 outputs an error address 131 and asserts an error flag signal 132. The error detector 107 receives the check address 155 from the address circuit 103 for error logging purposes, and may optionally output an error address as indicated by dashed line 131. In alternate embodiments, the reset signal 153 and/or read signal 151 may be supplied by an external device (e.g., a host processor) instead of the instruction decoder 105.

Figure 2:
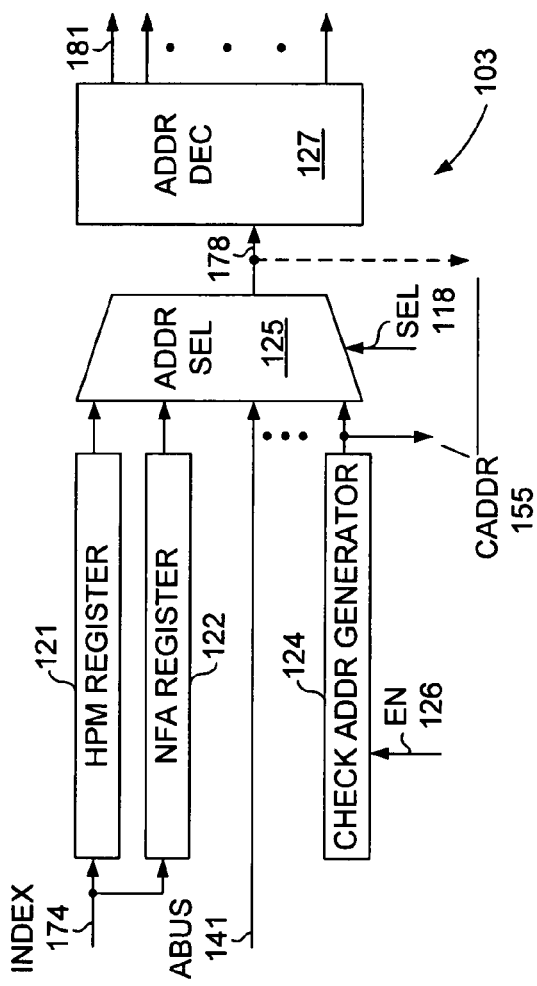
FIG. 2 illustrates an embodiment of the address circuit of FIG. 1 in greater detail.

FIG. 2 illustrates an embodiment of the address circuit 103 of FIG. 1 in greater detail. The address circuit 103 includes an address selector 125 that responds to the select signal 118 from the instruction decoder (i.e., element 105 of FIG. 1) by selecting an address 178 from one of a plurality of address sources. An address decoder 127 decodes the selected address 178 to activate one of a plurality of word lines 181. The address sources include one or more of a highest priority match (HPM) register 121, next free address (NFA) register 122, address bus 141, and check address generator 124. Additional address sources (not shown) may also be provided. The highest priority match (HPM) register 121 is loaded (e.g., under control of the instruction decoder) with a CAM index 174 generated during a compare operation and therefore points to the CAM word that produced the highest priority match in the most recent compare operation. The next free address register 122 is loaded with a CAM index 174 that points to the address of an empty row of CAM cells within the CAM array (i.e., the "next free address"). In one embodiment, the next free address is determined during a write operation based on the state of the validity values within the CAM array. The check address generator 124 is used to generate a sequence of check addresses for error checking purposes. In the embodiment of FIG. 1, the check address generator outputs one check address at a time and advances to the next check address in the sequence in response to the enable signal 126 from the instruction decoder.

The check address 155 may alternatively be output from the check address generator 124 or from the address selector 125. When the check address is output by the address selector 125, any address source, including the check address generator, may be used to supply the check address to the error detector (i.e., element 107 of FIG. 1). For example, a host-requested read operation may be performed at an address supplied via the address bus 141 or at the address indicated by the HPM register 121. In either case, error checking may be performed on the CAM word read out of the CAM array, and the output of the address selector 125 used to provide the check address to the error detector.

Although the HPM register 121, NFA register 122 and check address generator 124 are all shown as being part of the address circuit 103, these circuit blocks may alternatively be disposed elsewhere in the CAM device. For example, in one embodiment, the HPM register is implemented by a field of bits (i.e., to contain the HPM address) within a status register of the CAM device. In such an embodiment, the status register may be selected by the address selector to provide the HPM address for a CAM array access. Contents of the status register, including the HPM address, may also be output from the CAM device in a status read operation.

Still referring to FIG. 2, the check address generator 124 may be loaded to start error checking from a particular address within the CAM array. Also, the check address generator may be started from a known state, for example, upon device power-up or in response to a reset operation.

Figure 3:
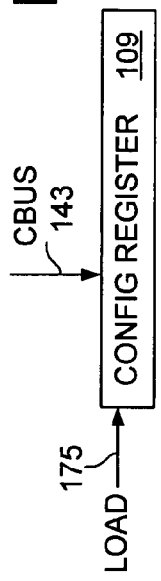
FIG. 3 illustrates a configuration register that may be included within the CAM device of FIG. 1.

FIG. 3 illustrates a configuration register 109 that may be included within the CAM device of FIG. 1 and used to provide configuration information to other circuit blocks within the CAM device. In one embodiment, the configuration register 109 is loaded, in response to a load signal 175 from the instruction decoder, with one or more configuration values received via the comparand bus 143. One or more other signal paths may be used to provide configuration information in alternative embodiments. Connections between the configuration register 109 and other circuit blocks within the CAM device are discussed below in connection with descriptions of specific types of configuration information.

Figure 4:
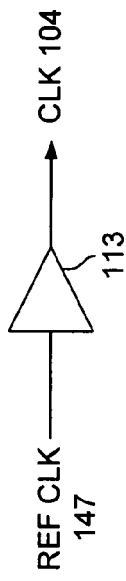
FIG. 4 illustrates a clock circuit that may be used within the CAM device of FIG. 1.

FIG. 4 illustrates a clock circuit 113 that may be used within the CAM device of FIGS. 1 to generate the clock signal CLK 104 based on an externally generated reference clock 147. The clock buffer 113 may include circuitry, such as a phase locked loop or delay locked loop, to increase or decrease the frequency of CLK 104 relative to the reference clock 147 and to provide phase offsets as needed to time reception and transmission of signals on the various buses coupled to the CAM device. For simplicity, FIG. 1 shows CLK 104 being supplied only to the instruction decoder 105. In actual implementation, CLK 104 and timing signals derived from CLK 104 may be provided to other circuit blocks within the CAM device 100.

CAM Array

Figure 5:
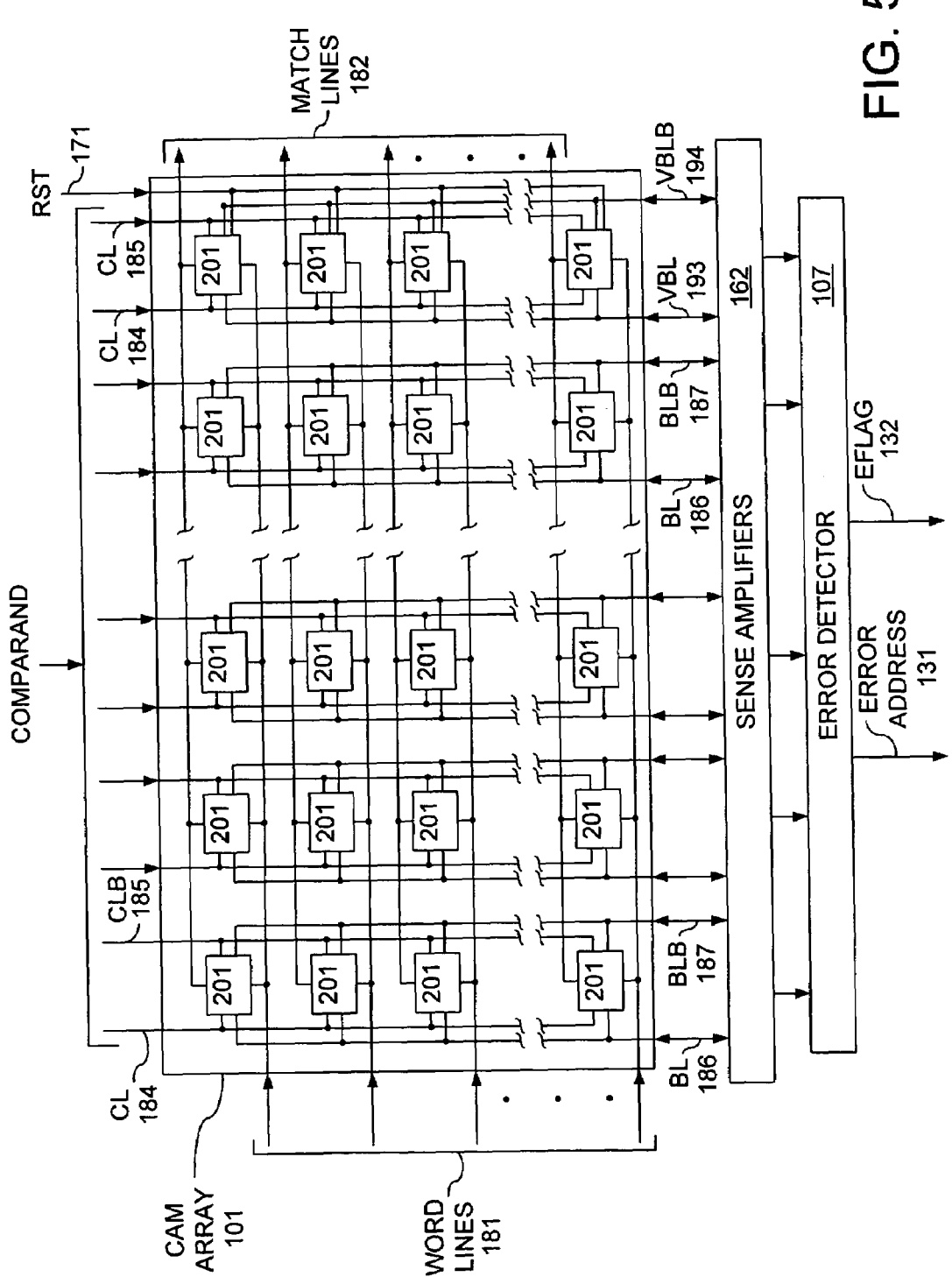
FIG. 5 illustrates the structure of the CAM array of FIG. 1 in greater detail.

FIG. 5 illustrates the structure of the CAM array 101 in greater detail. A plurality of CAM cells 201 are arranged in rows and columns, with each row of CAM cells 201 being coupled to a respective word line 181 and to a respective match line 182. Each of the word lines 181 is coupled to the address circuit 103 of FIG. 1, and each of the match lines 182 is coupled to the priority encoder 114 and the flag circuit 112 of FIG. 1. Each of the CAM cells 201 in a given column is coupled to a pair of bit lines, BL 186 and BLB 187, and to a pair of comparand lines, CL 184 and CLB 185. Each CAM cell 201 preferably includes a memory cell to store at least one binary bit of data, and a compare circuit to compare the content of the memory cell with a comparand signal and its complement presented on the comparand lines CL 184 and CLB 185. Each CAM cell 201 may further include a local mask cell to store a local mask value (such a CAM cell is referred to as a ternary CAM cell). In one embodiment, the memory cell of each CAM cell 201 is a static storage element implemented by back-to-back coupled inverters. In alternative embodiments, different types of storage cells may be used including, without limitation, dynamic storage elements (typically implemented by a single transistor and charge storage element), non-volatile storage elements or any other type of storage element that can be used to store digital data. In the case of a ternary CAM cell, the local mask cell may likewise be implemented using back-to-back coupled inverters or any of the different types of storage cells mentioned above.

During a compare operation, a respective portion of the comparand is applied to each column of CAM cells 201 via lines CL/CLB such that the complete comparand is applied to each row of the CAM cells 201 simultaneously. In one embodiment, each of the match lines 182 is 4 precharged to a high logical level at the start of a comparison operation, but pulled down to a low logical level by the compare circuit within any attached CAM cell 201 that receives comparand signals which do not match the stored data value. In this configuration, any match line 182 not pulled low constitutes a match signal. The match lines 182 are coupled to the flag circuit 112 of FIG. 1 which determines whether any match signals are asserted and, if so, asserts the match flag signal 176. The flag circuit may also assert a multiple match flag signal if more than one match signal is asserted. The match lines 182 are also coupled to the priority encoder 114 of FIG. 1 which determines the highest priority match signal according to a predetermined prioritization policy and outputs an index (i.e., a CAM index) that corresponds to the CAM array location that produced the match signal.

During a read or write access to the CAM array 101, an address of CAM cells to be accessed is supplied to the address decoder 127 of FIG. 2. The address decoder 127 decodes the address to activate the word line 181 that corresponds to the selected row of CAM cells. The activated word line effectively couples the memory cells of the selected row of CAM cells to the bit lines BL/BLB (e.g., by way of pass gates coupled between the memory cells and the bit lines), thereby enabling data to be read out of or written into the selected row. In a write operation, a signal driving circuit (not shown in FIG. 5) within the read/write circuit 161 of FIG. 1 is enabled by the instruction decoder to drive a CAM word or local mask word onto the bit lines BL/BLB (additional bit lines, not shown in FIG. 5, may alternatively be provided to access the local mask cells to store or read a local mask word). The signals present on the bit lines are then latched or otherwise stored in the memory cells in the selected row of CAM cells. During a read operation, the contents of the memory cells (or local mask cells) of the selected row are enabled onto the bit lines BL/BLB where they are sensed by a bank of sense amplifiers 162 within the read/write circuit.

Reflecting on the structure of CAM array 101, it can be seen that providing separate signal paths to the CAM cells 201 for comparand and data values enables data to be output from the CAM array 101 concurrently with a comparand being input into the CAM array 101 for comparison purposes. By this arrangement, a CAM word (or local mask word) may be read from the CAM array for error checking purposes concurrently with performance of a compare operation. As mentioned, this concurrency of comparison and error checking operations provides significant advantages over the prior art technique described above, including the ability to do systematic background error checking with little or no reduction in compare bandwidth.

Still referring to FIG. 5, the CAM array 101 also includes validity storage cells 202 which form the validity storage discussed above in reference to FIG. 1. In one embodiment, the validity storage cells are similar to the CAM cells 201, but include additional circuitry to initialize the validity values to a predetermined state at device power-up. For example, in the case of validity storage cells 202 having volatile memory cells, the validity storage cells 202 preferably include circuitry to force the validity value within each validity storage cell 202 to a reset state in response to a reset signal asserted on line 171, thus indicating that none of the rows of CAM cells 201 include valid CAM words. Thereafter, as CAM words are written to selected rows of CAM cells 201, the validity values within the corresponding validity storage cells 202 are set to indicate storage of valid CAM words.

In one embodiment, each validity value is represented by a single binary bit, called a validity bit. In a first state (i.e., when set), the validity bit indicates that the corresponding row of CAM cells contains a valid CAM word. Conversely, in a second state (i.e., when reset), the validity bit indicates that the corresponding row of CAM cells does not contain a valid CAM word. In alternative embodiments, two or more bits may be used to represent the validity value. For example, in one alternative embodiment, the validity value is formed by a pair of bits: a skip bit and an empty bit. The skip bit indicates that the corresponding row of CAM cells are to be skipped (i.e., ignored) during a compare operation, while the empty bit indicates that no CAM word is stored in the corresponding row of CAM cells. Thus, the skip bit and the empty bit are each reset to indicate that a valid CAM word is stored in the corresponding row of CAM cells. In the interest of clarity, the validity value is described as a validity bit in the remainder of the present description. However, any number of bits may be used to form the validity value in alternative embodiments.

During a compare operation, the validity bits are used to prevent match signal assertion for those rows of CAM cells which do not contain valid CAM words. For example, in the embodiment described above in which the match line is pulled low to signal a mismatch, each reset validity bit prevents assertion of a match signal by pulling the match line low for the corresponding row of CAM cells. Consequently, no match is signaled for rows having reset validity bits regardless of whether the row contents match the comparand. During a read operation, the validity bit is sensed (i.e., via lines 193 and 194) along with the CAM word and forwarded to the error detector 107 where it is used to prevent assertion of the error signal 132 and logging of an error address 131 for invalid CAM words.

Error Detector

Figure 6:
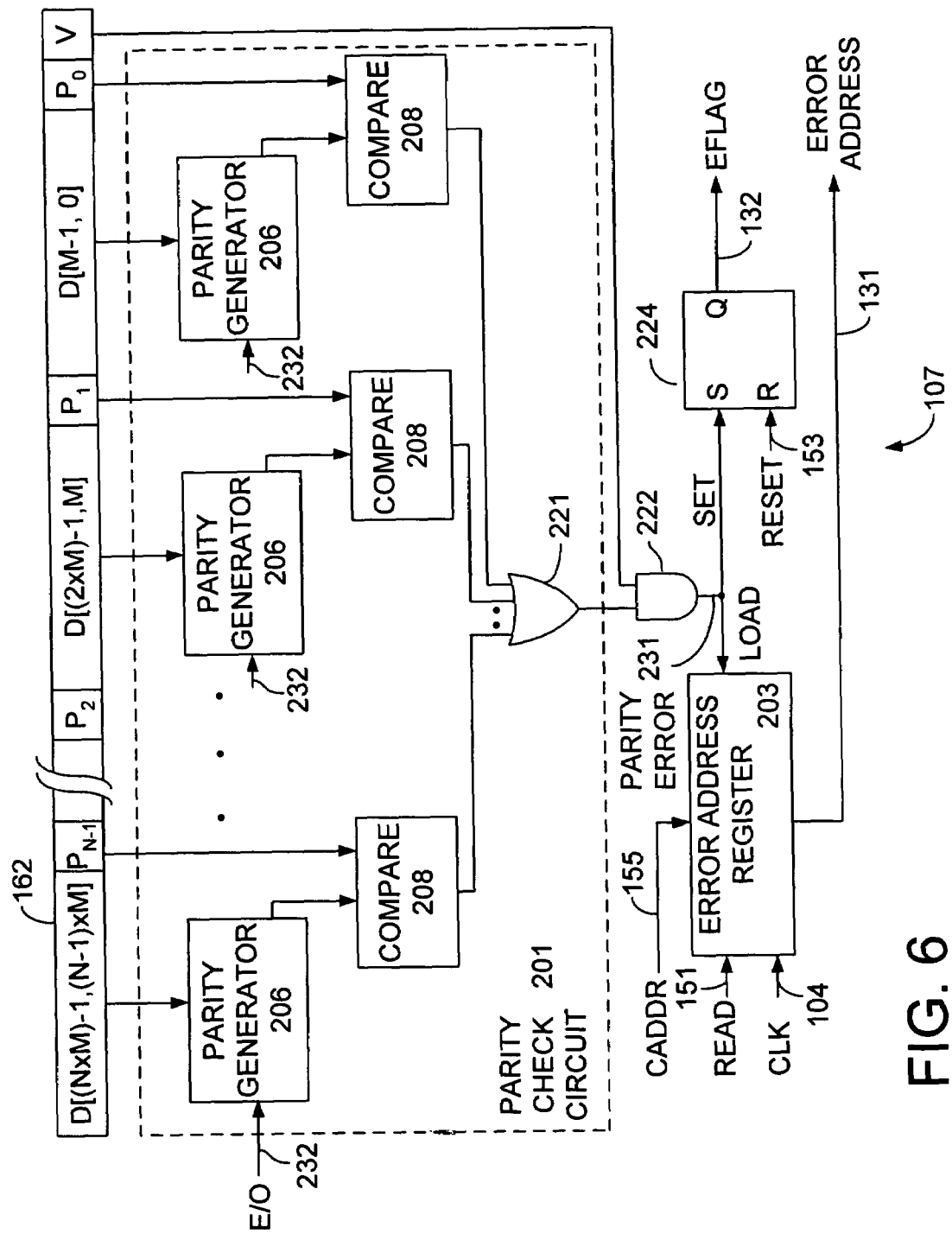
FIG. 6 is a block diagram of an error detector according to a parity checking embodiment.

FIG. 6 is a block diagram of the error detector 107 of FIG. 1 according to a parity checking embodiment. As shown, a CAM word formed by of N groups of M data bits is output from the sense amplifier bank 162. The first group of data bits is designated D[M−1, 0], the second group of data bits is designated D[(2×M)−1, M] and so forth to the final group of data bits designated D[(N×M)−1, (N−1)×M]. The CAM word also includes N parity bits, one for each group of M bits. Although N parity bits are depicted in FIG. 6, any number of parity bits per CAM word may be used in alternative embodiments. For example, a single parity bit may be used for the entire CAM word.

The data and parity bits are input to a parity check circuit 201 that includes a separate parity generator 206 and compare circuit 208 for each group of data bits and its corresponding parity bit. Each parity generator 206 generates a binary output according to the state of an even/odd select signal 232 and the number of set (or reset) data bits within the corresponding group of data bits. For example if the even/odd select signal 232 selects odd parity, circuitry within the parity generator 206 will output a logic '1' if the input group of data bits contains an odd number of logic '1' data bits, and a logic '0' if the group of data bits contains an even number of logic '1' data bits. If the even/odd select signal 232 selects even parity, the output of the parity generator 206 is inverted, i.e., outputting '1' if the input group of data bits contains an even number of logic '1' data bits and a logic '0' if the group of data bits contains an odd number of logic '1' data bits. In alternative embodiments, the logic states may be inverted so that the parity generator 206 outputs a logic '0' if the number of logic '0' data bits is odd or even (in the case of odd parity selection or even parity selection, respectively). Also, the output of the parity generator 206 may be inverted so that, if odd or even parity is selected, the total number of bits in the logic '1' state, including the bit output by the parity generator, is always odd or even, respectively.

Figure 8:
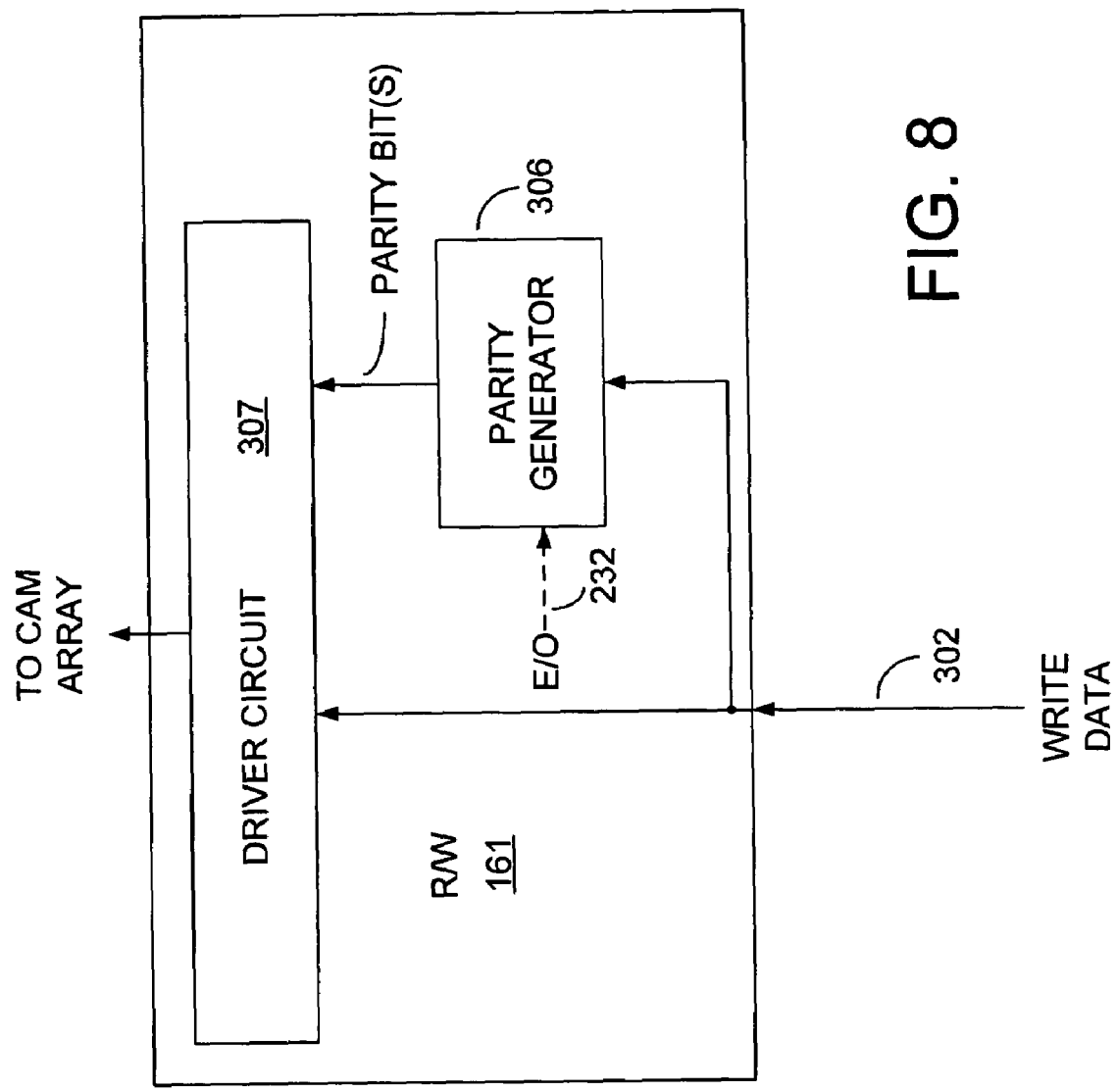
FIG. 8 illustrates a read/write circuit that includes parity generation circuitry.

The parity generator 206 is preferably formed using conventional combinatorial circuitry, for example a combination of exclusive OR gates, to produce a parity result shortly after a CAM word is loaded into the row buffer 162. The even/odd select signal 232 may be output from a configuration register (e.g., element 109 of FIG. 3) according to a configuration value programmed by the host processor. In one embodiment, the parity bits stored in the CAM array are generated by circuitry external to the CAM device (e.g., the host processor), then written to the CAM array along with the corresponding CAM word. Accordingly, such parity bits may be selected to produce either odd or even parity according to the configuration of the external parity bit generator. In that case the even/odd select signal 232 may be programmed by the host to match the parity configuration of the external parity bit generator. In an alternative embodiment, shown in FIG. 8, parity generation circuitry 306 within the read/write circuit 161 (element 161 of FIG. 1) may be coupled to the write data path 302 and used to generate one or more parity bits. The write data and corresponding parity bits are then written into the CAM array by driver circuit 307 during a CAM write operation. The even/odd select signal 232 may be input to the parity generation circuitry 306 or, alternatively, the even/odd select signal 232 may be omitted altogether (i.e., omitted from read/write circuit 161 and error detector 107 of FIG. 6) and the even/odd selection may be hardwired for either even or odd parity generation. In alternative embodiments, parity functions other than even and odd parity may be used.

Returning to FIG. 6, the compare circuit 208 compares the output of the parity generator 206 with the corresponding stored parity bit. Compare circuit 208 is preferably a combinatorial logic circuit such as an XOR circuit that outputs a logic '1' only if the stored parity bit and the parity bit generated by the parity generator 206 do not match, but may alternatively be any type of circuit for detecting mismatch between the stored and generated parity bits. The outputs of all the compare circuits 208 are logically ORed in gate 221 so that, if any one of the compare circuits 208 signals a mismatch (i.e., a logical '1'), the parity check circuit 201 will output a logical '1'. For embodiments in which a single parity bit is used for an entire CAM word, OR gate 221 may be omitted. As shown in FIG. 6, the output of the parity check circuit 201 is gated by the validity bit for the CAM word in AND gate 222 to generate a parity error signal 231. That is, even if a parity mismatch is signaled by the parity check circuit 201, the parity error signal 231 will not be asserted by AND gate 222 unless the validity bit for the CAM word being error checked indicates that the CAM word is valid. By this arrangement, parity errors are signaled only for valid CAM words.

The parity error signal 231 is supplied to the set input of an S-R flip-flop and to the load input of an error address register 203. The check address 155 from the check address generator (element 124 of FIG. 2), which constitutes a parity address in this example, is also input to the error address register 203 so that, if the parity error signal 231 is asserted, the parity address is loaded into the error address register 203. As shown in FIG. 6, CLK 104 is input to the error address register 203 to initiate the load operation, but another timing signal may be used to initiate the load operation in an alternative embodiment. As described below, the error address register 203 may be designed to store only a single error address (i.e., address of a location within the CAM array that produced a parity error), or the error address register 203 may be designed to store multiple error address entries. In either case, one entry within the error address register is preferably used to produce the error address signal 131. In the case of a multiple-entry error address register, the read signal 151 may be used to advance the entries in the error address register 203. In the case of a single-entry error address register, the read signal may be omitted.

Still referring to FIG. 6, the S-R flip-flop 224, when set, drives the error flag signal 132. As described above, the error flag signal 132 is preferably output directly to a host device to signal the error condition, but may alternatively (or additionally) be output as part of a status word during a host-requested status read operation. The reset signal 153 is received from the instruction decoder as shown in FIG. 1 and is used to clear the error flag signal by resetting the S-R flip-flop 224.

Figure 22:
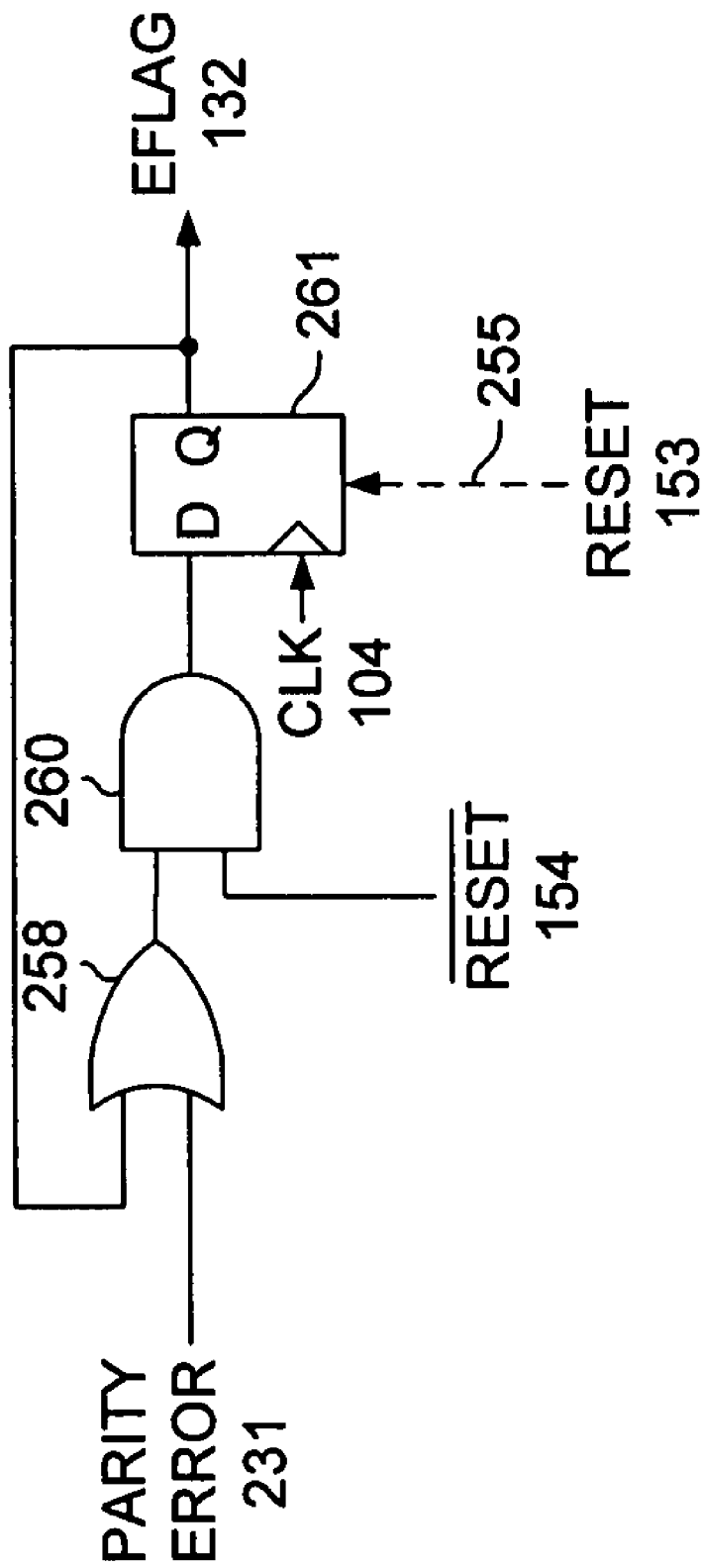
FIG. 22 illustrates a synchronous storage element which set by assertion of a parity error signal.

In alternative embodiments, storage elements other than an S-R flip-flop may be used to register the error condition. For example, FIG. 22 illustrates a synchronous storage element 261 which is set by assertion of the parity error signal 231 during a CLK transition. The output of the synchronous storage element 261, i.e., the error flag signal 132, is logically ORed with the parity error signal 231 in gate 258 so that the error flag signal 132 remains asserted after the parity error signal 231 is deasserted. In one embodiment, the output of the OR gate 258 is ANDed with an active low version of the reset signal 154 in gate 260 before reaching the input of the synchronous storage element. By this arrangement, the error flag signal 132 is reset at any CLK transition in which the active low reset signal 154 is asserted. In an alternative embodiment, the AND gate 260 may be omitted and the reset signal 153 applied to a dedicated reset input of the synchronous storage element 261. This alternative embodiment is depicted by the dashed arrow 255.

Figure 7:
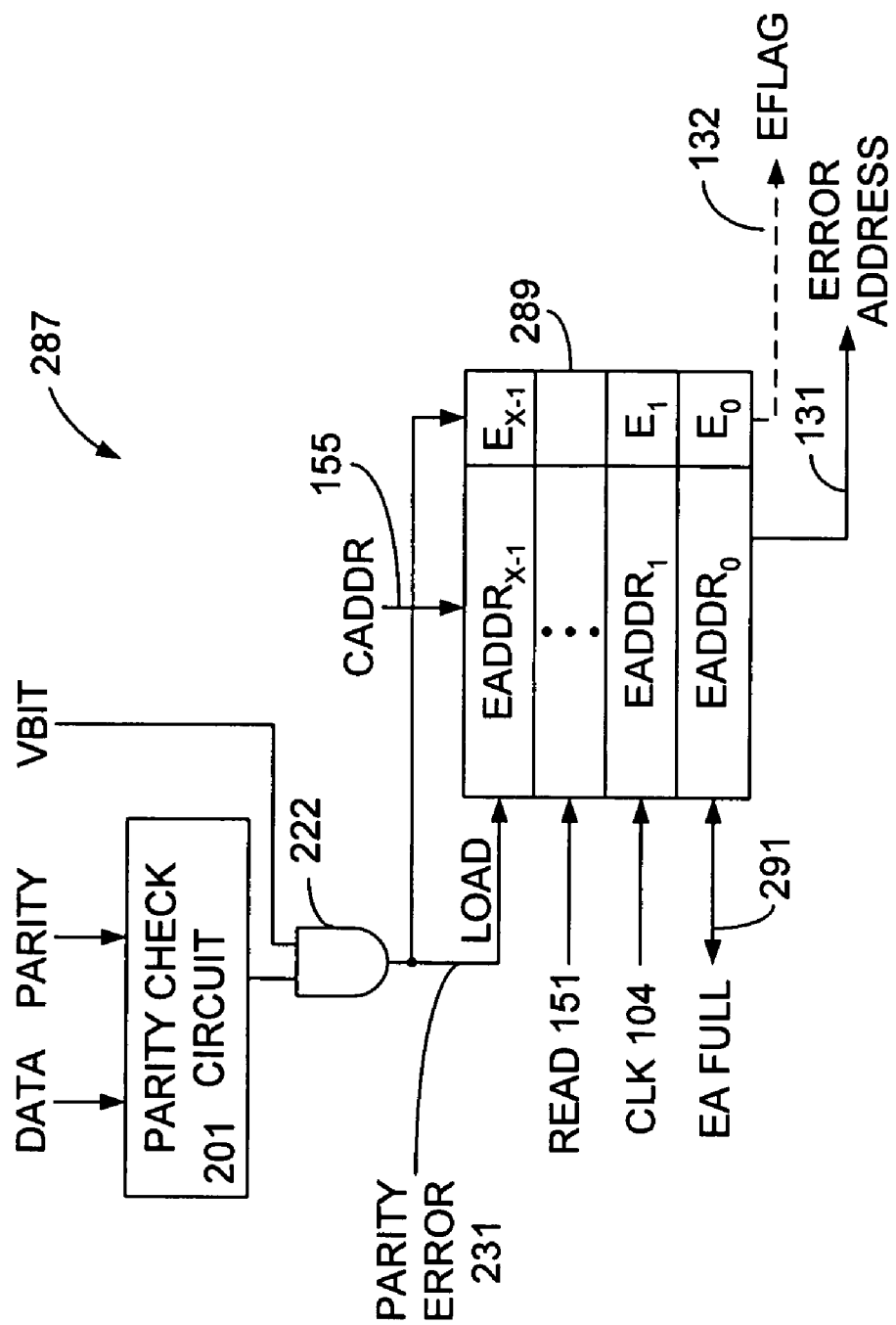
FIG. 7 illustrates an alternative embodiment of an error detector.

FIG. 7 illustrates an alternative embodiment of an error detector 287 in which a multiple-entry error address register 289 is provided and in which a separate error flag value ($E_0$–$E_{X-1}$) is stored along with each error address in the error address register. The multiple-entry error address register 289 preferably operates as a first-in-first-out (FIFO) storage having head and tail entries. The error flag value for the head entry in the FIFO (i.e., $E_0$) is used to produce the error flag signal 132 and the error address value stored in the head entry (i.e., $EADDR_0$) is used to drive the error address signal 131. Accordingly, if the head entry in the FIFO contains an error entry (i.e., error flag value $E_0$ is set), the error flag signal 132 will be asserted and the address of the CAM word containing the error will be present on the error address output 131. Conversely, if the head entry in the FIFO does not contain an error entry ($E_0$ is not set), the error flag signal 132 will not be asserted.

Still referring to FIG. 7, the parity check circuit 201 and logic gate 222 function as described in reference to FIG. 6 to generate a parity error signal 231 if the CAM word under test contains an error and is indicated to be valid by the corresponding validity bit. As shown, the parity error signal 231 is used to signal the error address register 289 to load the check address 155 into a register entry and to set the error flag for the entry. The error address register load operation may be timed by the CLK signal 104 as shown, or by another timing signal.

The read signal 151 is asserted during an error address read operation to advance the contents of the error address register 289. More specifically, when the read signal 151 is asserted, the contents of the error address register 289 are shifted forward so that the entry depicted in FIG. 7 as $EADDR_1/E_1$ becomes the head entry $EADDR_0/E_0$, entry $EADDR_2/E_2$ becomes $EADDR_1/E_1$ and so forth. This entry shifting may be accomplished either by actual shifting of contents from one entry to the next or by shifting of pointers that indicate the head and tail entries within the error address register 289. In the content shifting embodiment, the error flag value for the former tail entry is cleared when the shift is complete to indicate that the entry is free to receive a new error address. In the case of pointer shifting, the error flag value for the former head entry is cleared to indicate that the entry does not contain a valid error address.

The error address register 289 is depicted as having X entries (0 to X–1) available for error address storage. If all X entries of the error address register are filled with valid error addresses, a full signal, EA FULL 291, may be asserted to indicate the full condition. The full signal 291 is preferably provided to the instruction decoder (element 105 of FIG. 1) to stall further error checking until one or more error address read operations are performed to free entries in the error address register 289. The full signal 291 may also be output from the CAM device (e.g., directly or in response to a status read) to signal the full condition to the host processor or other entities external to the CAM device.

Figure 9:
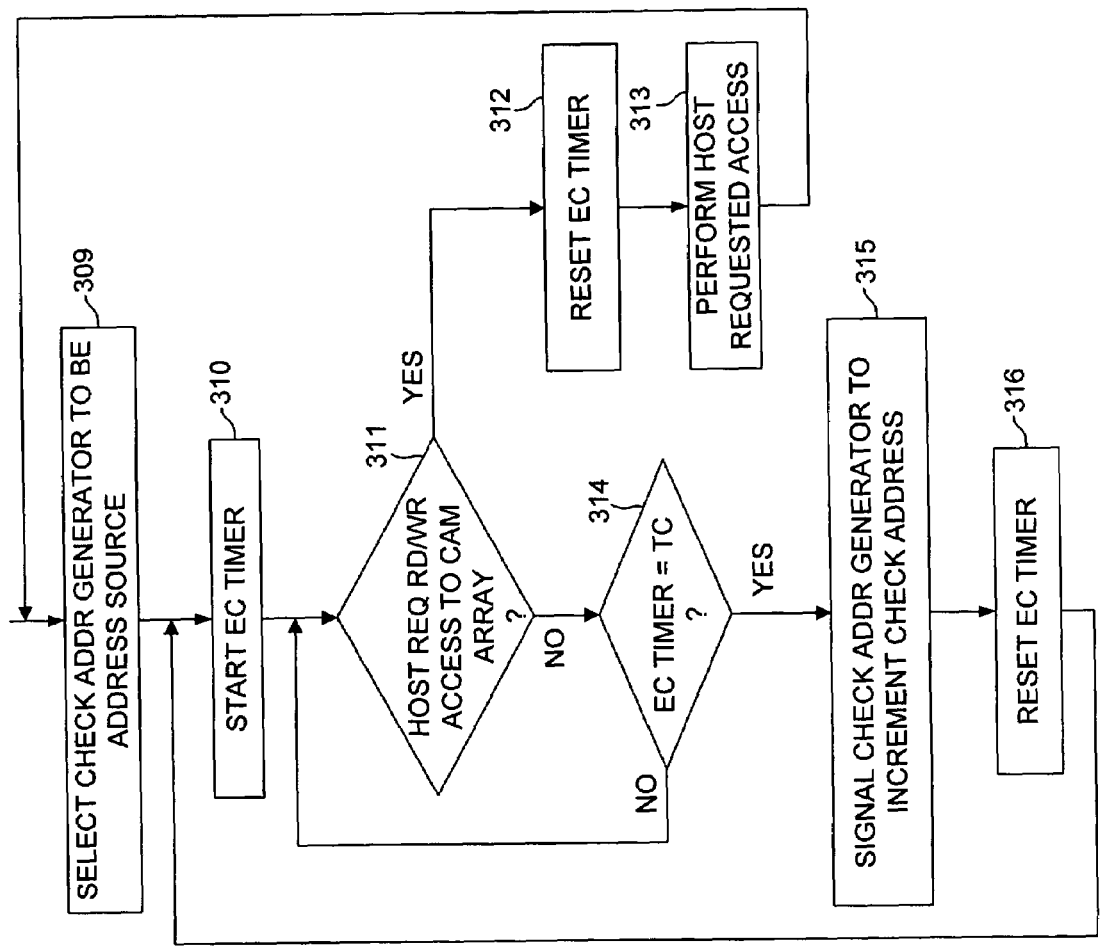
FIG. 9 illustrates the operation of an instruction decoder according to one embodiment.

Instruction Decoder Operation—Concurrent Instruction Execution and Parity Check FIG. 9 illustrates the operation of an instruction decoder (e.g., element 105 of FIG. 1) to control background error checking according to one embodiment. Initially, in block 309, the instruction decoder selects the check address generator to be the address source for a read access to the CAM array. At block 310, the instruction decoder starts an error check timer. In one embodiment, the timer is a counter that counts up or down from an initial value (the reset value) until a predetermined terminal count value is reached, the difference between the initial value and the terminal count corresponding to the time required to complete an error checking operation on the CAM array. During the error check operation, the instruction decoder monitors incoming instructions in decision block 311 to determine whether a host processor has requested read or write access to the CAM array. If so, the instruction decoder resets the error check timer in to the initial value in block 312, then issues the appropriate signals to perform the host requested access in block 313. A predetermined time later (according to the amount of time required to complete the host requested operation), the instruction decoder restarts the error check operation at block 309.

The instruction decoder continues to monitor incoming instructions in decision block 311 until the error check timer has reached the terminal count value (as determined at decision block 314). After the error check timer has reached the terminal count, the instruction decoder signals the check address generator to increment the check address (block 315) and resets the error check timer at block 316, before beginning another error check operation at block 310.

In an alternative embodiment, the error flag signal is provided to the instruction decoder, which selectively enables the check address generator to increment the check address according to whether a parity error is detected. Accordingly, if the error flag signal is determined to be set after decision block 314, the error check operation is completed without signaling the check address generator to increment the check address and further error checking is halted until remedial action is taken (e.g., self-invalidation or self-correction, discussed below, or action by the host). Alternatively, if the error detector includes a multiple-entry error address register, the instruction decoder may signal the check address generator to increment the check address despite error flag signal assertion so long as the error address register is not full. In such an embodiment, a full signal may be output by the error address register to notify the instruction decoder when the error address register is full (i.e., when all entries of the error address register have been loaded with error addresses).

In the embodiment illustrated by FIG. 9, the instruction decoder does not disable the check address generator from incrementing the check address except in response to a host instruction. The host processor may, for example, detect assertion of the error flag signal and issue an instruction to the CAM device to halt further testing until the host processor takes remedial action (e.g., restores a valid CAM word to the CAM array location indicated by the error address).

As mentioned above in reference to FIG. 2, error checking may be performed not only on CAM words selected by the check address generator, but on any CAM word read from the CAM array. For example, performing the host requested access in block 313 may involve reading a CAM word from the array at a host-supplied address (or other address source such as the HPM register), then error checking the CAM word in the manner described above. As discussed in reference to FIG. 2, the check address may be selected by the address selector 125 so that a proper check address may be stored by the error detector regardless of the address source.

Configurable Multi-Block CAM Device

Figure 10:
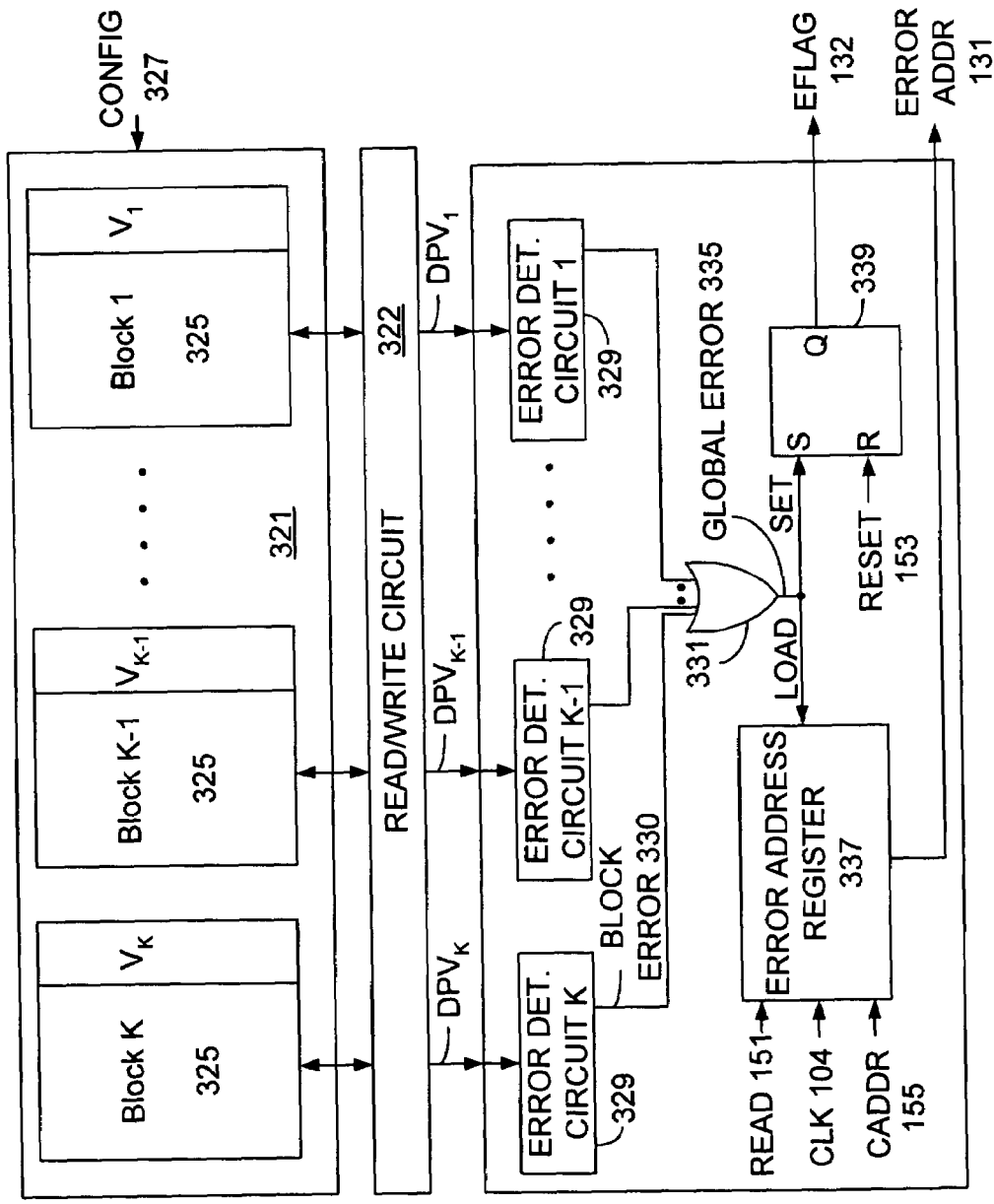
FIG. 10 illustrates the CAM array, read/write circuit and error detector of a CAM device having multiple, configurable storage blocks.

FIG. 10 illustrates the CAM array 321, read/write circuit 322 and error detector 323 of a CAM device having multiple, configurable storage blocks 325. In the embodiment of FIG. 10, each of the storage blocks 325, designated 1 through K, is coupled to the read/write circuit 322 and has a storage width and depth according to a configuration signal, CONFIG 327. In alternative embodiments, the storage width and depth of one or more (or all) of the storage blocks may be fixed and the configuration signal 327 omitted.

Sense amplifier circuitry within the read/write circuit 322 is used to sense a CAM word output from the CAM array 321 during an error check operation as described in reference to FIG. 5. As described below, error check operations may be performed on each of the storage blocks 325 in sequence or concurrently on all the storage blocks 325. In either case, the data, parity and validity values (referred to collectively as a "DPV" value) for the output CAM word is forwarded to an error detection circuit 329 that corresponds to the block containing the CAM word. Each of the error detection circuits, in turn, outputs a parity error signal for its respective block, referred to as a block parity error signal 330. The block parity error signals 330 from the error detection circuits 329 are logically ORed in gate 331 to produce a global parity error signal 335. The global parity error signal 335 is coupled to the load input of the error address register 337 and the set input of the S-R flip flop 339. Accordingly, when a parity error is signaled by any of the error detection circuits 329, the resulting global parity error signal is used to load the check address 155 (e.g., from the check address generator) into the error address register 337 and is used to set S-R flip-flop 339. The error address register 337 and S-R flip flop 339 output the error address 131 and error flag signal 132, respectively, and respond to the read signal 151, CLK 104 and reset signal 153 as described above in reference to FIGS. 3 and 4. As discussed, other circuits may be used to register or latch the error flag signal. Also, the error address register may be a single or multi-entry register and may be implemented according to any of the different embodiments described in reference to FIGS. 3 and 4.

For embodiments that concurrently perform error checking on CAM words from each of the different storage blocks, error detector 323 may include additional circuitry (not shown) to store a value indicative of which of the error detection circuits 329 has signaled a block error 330. This value, referred to as a block identifier, is preferably stored along with the check address 155 within the error address register 337. The block identifier may then be output from the error address register 337 as part of the error address to enable a host or other circuitry within the CAM device to identify the block or blocks within the CAM array 327 that produced the error indication.

Figure 11:
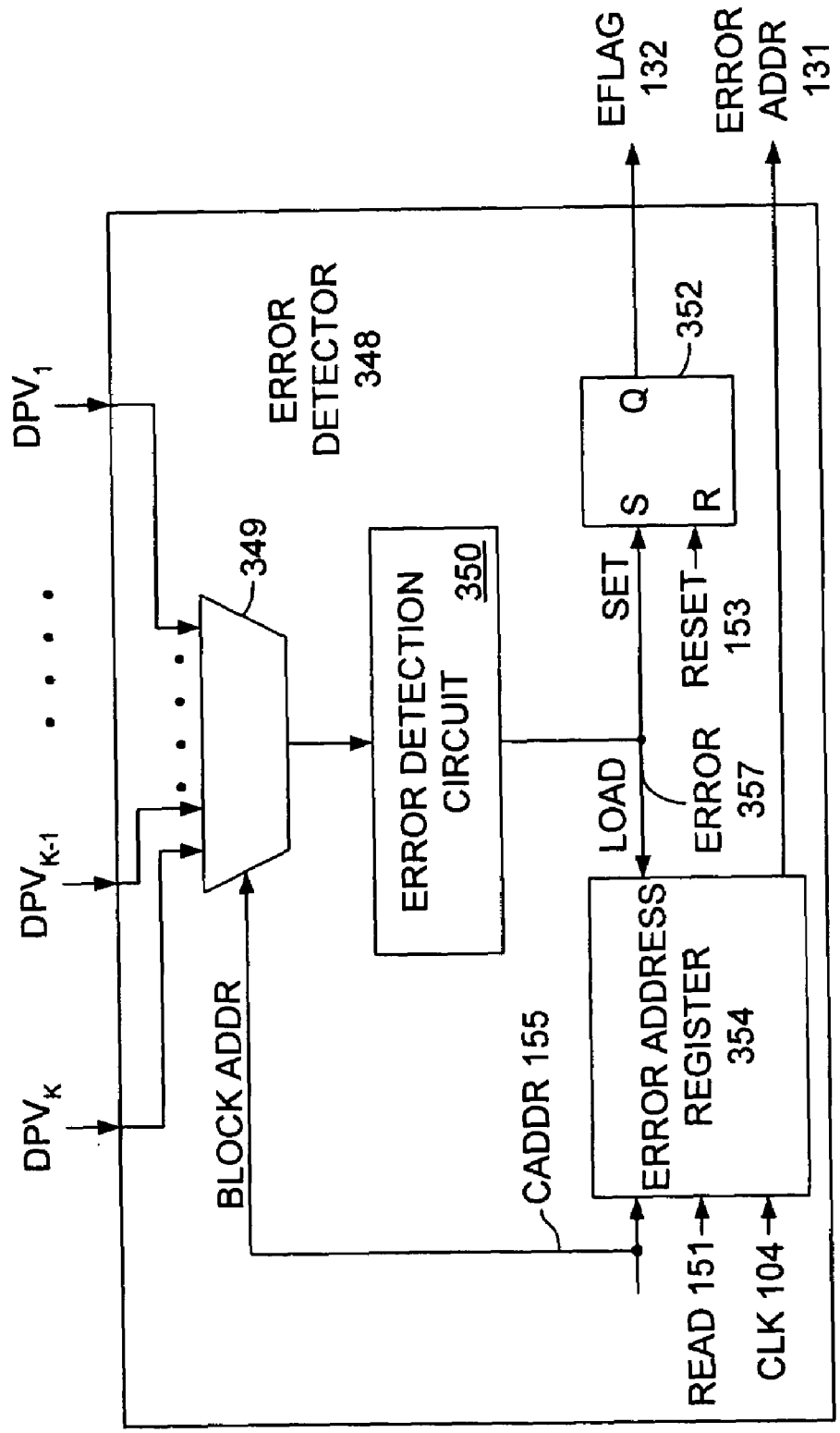
FIG. 11 illustrates an alternate error detector for use with a CAM device having multiple storage blocks.

Although error detector 323 may be used to simultaneously error check a respective CAM word from each of the blocks, the provision of separate error detection circuits for each storage block increases the transistor count and complexity of the error detector implementation. In embodiments of the multiple storage block CAM device that error check one CAM word at a time, the multiple error detection circuits 329 may be omitted in favor of a single error detection circuit that is selectively coupled to the output of each of the storage blocks 325. An error detector 348 having such an alternative arrangement is illustrated in FIG. 11. The DPV values from each of the K storage blocks are coupled to respective inputs of a multiplexer 349. Block address bits from within (or derived from) the check address 155 are supplied to a select input of the multiplexer 349 to select the DPV value from the storage block being error checked. The error detection circuit 350 then generates a error signal 357 in the manner described above, the error signal 357 being used to set the error flag signal 132 (i.e., in S-R flip flop 352 or other storage circuit) and also to signal the error address register 354 to load the check address 155 at the next CLK 104 transition. The read and reset signals (151, 153) operate as described above to advance the entries within the error address register and reset the error flag signal, respectively. Also, the error address register 354 may be a single or multi-entry register and may be implemented according to any of the different embodiments described above.

Configurable Storage Block

Figure 12:
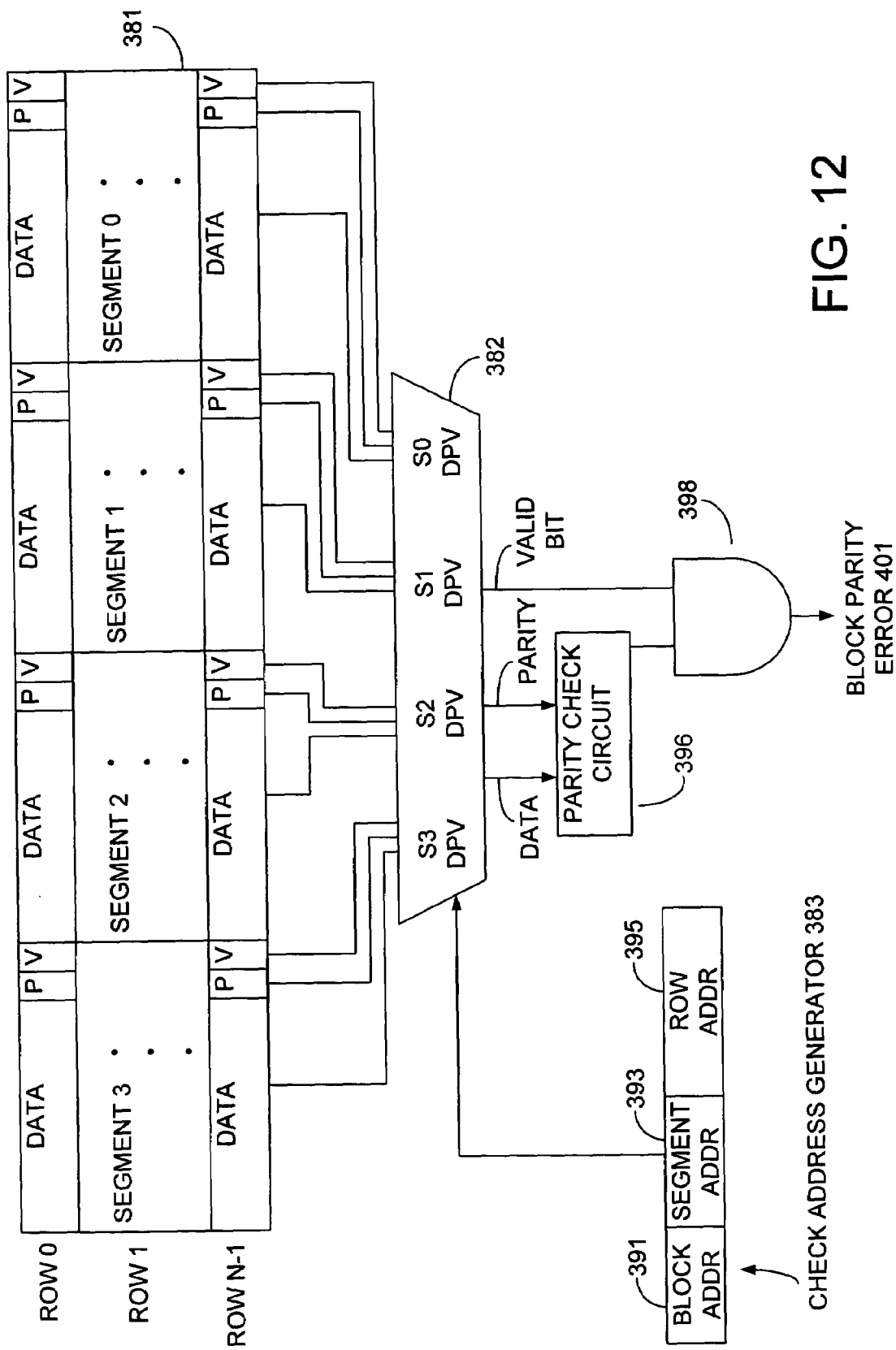
FIG. 12 illustrates the structure of an exemplary configurable storage block that may be used within the CAM array of FIG. 10.

FIG. 12 illustrates the structure of an exemplary configurable storage block 381 that may be used within the CAM array of FIG. 10. As shown, the storage block 381 is organized in four segments (0 to 3, although more or fewer segments may be used) with each segment including N rows of CAM cells (0 to N−1), a parity value and a valid value. As with the CAM cells in embodiments described above, each CAM cell may have any type of storage cell, and may be a ternary CAM cell. The contents of the CAM cells are designated "DATA" in FIG. 12 and may include CAM words and local mask words.

A configuration signal (not shown), for example from configuration register 109 of FIG. 3, is used to determine how the segments are accessed in a host requested read or write operations and, therefore, how CAM words (and local mask values) are stored in the storage block 381. For example, in a first configuration, each segment is used to store N distinct 72-bit CAM words so that the storage dimension of the storage block 381 is 4N×72 bits. This configuration is referred to as a "by one" configuration (×1) to indicate that the CAM word is one segment wide. In a x2 configuration, each pair of segments (i.e., segment pair 0, 1 and segment pair 2,3) is used to store 144-bit CAM words so that the storage block 381 has a storage dimension of 2N×144 bits. In x4 configuration, all four segments are used to store 288-bit CAM words so that the storage block 381 has a storage dimension of N×288 bits. It will be appreciated that more or fewer than 72 bits per segment may be provided in alternative embodiments and that numerous other configurations may be achieved in storage blocks having additional segments or different distributions of validity values within the storage block. Also, while a single parity bit per segment is shown in FIG. 12, any number of parity bits may be provided per segment in alternative embodiments (e.g., as shown in FIG. 6).

In the embodiment of FIG. 12, parity checking is performed one segment after another for each segment within the storage block 381, regardless of storage dimension configuration. In such an embodiment, the check address generator 383 preferably generates a check address having three components: a block address component 391 to select the storage block to be parity checked, a segment address component 393 to select the segment to be parity checked within the selected storage block, and a row address component 395 to select a row within the selected segment of the selected bock (note that the check address may be a single value, with the block, segment and row address components being represented by selected bits within the check address). The segment address component 393 of the check address is input to the multiplexer 382 to select the appropriate DPV value from the storage block 381. The data and parity values are supplied to a parity check circuit 396 to determine whether there is a parity mismatch. The output of the parity check circuit 396 is gated by the validity bit in AND gate 398 to produce a block parity error signal 401. The block parity error signal 401 may then be logically ORed with block parity error signals from other blocks to produce a global parity error signal as shown in FIG. 10. Also, though not shown in FIG. 12, the multiplexer 382 may be extended (or a second multiplexer provided) to allow selection of a DPV value from a selected segment (indicated by the segment address component of the parity address) from a selected block (indicated by the block address component of the parity address) for input to a single error detection circuit as shown in FIG. 11.

Figure 13:
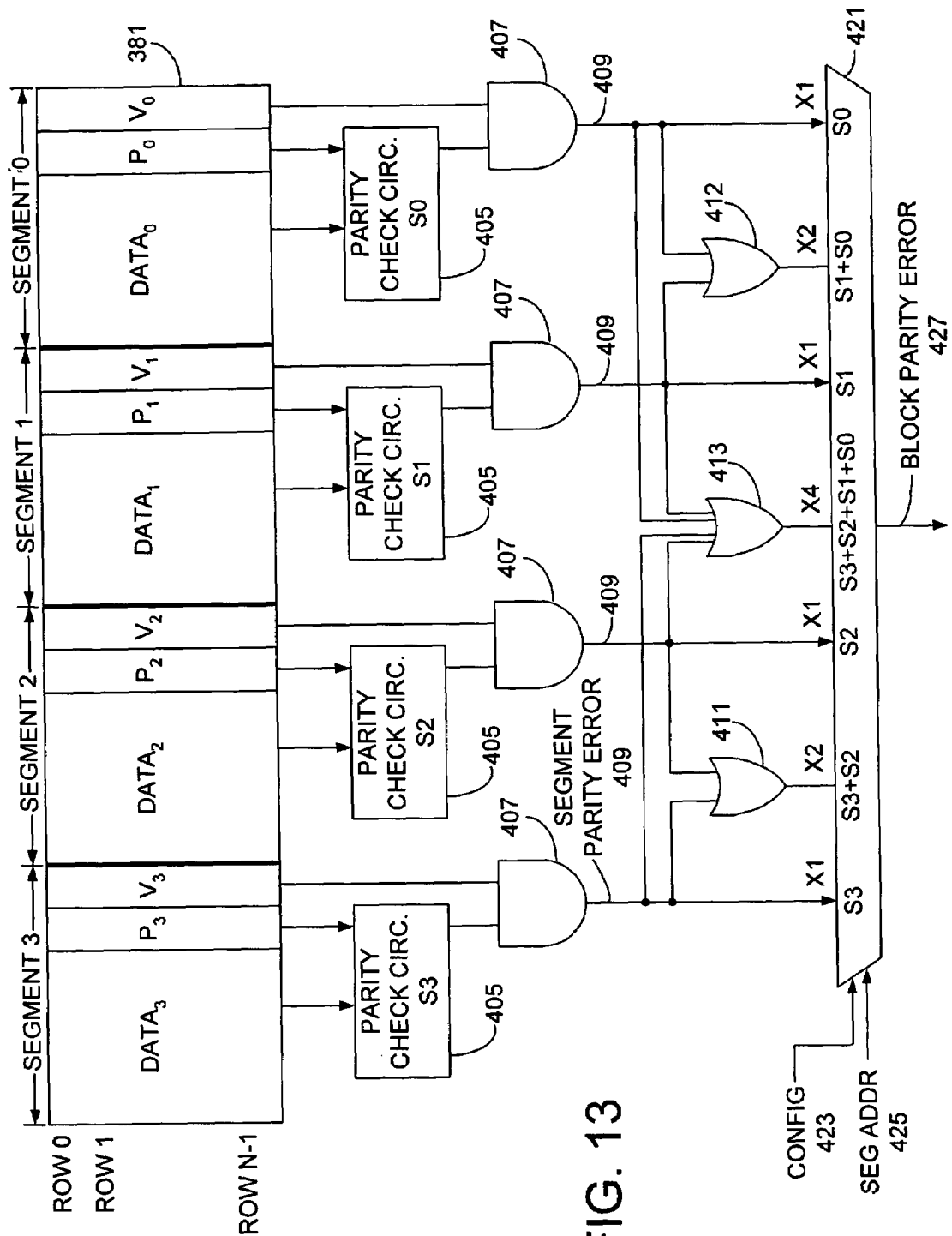
FIG. 13 illustrates a circuit for generating a block parity error signal.

FIG. 13 illustrates a circuit for generating a block parity error signal 427 through concurrent parity checking of complete CAM words regardless of whether the storage block 381 is configured to store a x1, x2 or x4 CAM word. As shown, four distinct parity check circuits 405 are coupled respectively to receive the data and parity values from the four segments of the storage block 381 (more or fewer parity check circuits 405 may be provided according to the number of storage block segments). The output of each parity check circuit is ANDed in a respective logic gate 407 with the validity bit from the corresponding segment to produce a segment parity error signal 409. The four segment parity error signals 409 are input individually and in logical combinations with one another to multiplexer 421 The logical combinations include: (1) ORing the segment 3 parity error signal with the segment 2 parity error signal in OR gate 411 to produce a x2 parity error signal indicative of whether a x2 CAM word spanning segments 2 and 3 has a parity error; 2) ORing the segment 1 parity error signal with the segment 0 parity error signal in OR gate 412 to produce a x2 parity error signal indicative of whether a x2 CAM word spanning segments 0 and 1 has a parity error; and 3) ORing all the segment parity error signals in OR gate 413 to produce a x4 parity error signal indicative of whether a CAM word spanning all four segments has a parity error. Additional combinations of segment parity error signals 409 may be provided in alternative embodiments.

Still referring to FIG. 13, the multiplexer 427 is responsive to a configuration signal 423 (e.g., from the configuration register 109 of FIG. 3), and a segment address 425 (e.g., from the check address generator) to select one of the individual segment parity error signals 409 or one of the logical combinations of segment parity error signals (i.e., x2 or x4 parity error signals) to drive the block parity error signal 427. For example, if the configuration signal 423 indicates a x1 configuration, then the segment address 425 is used to select one of the four segment parity error signals 409 to drive the block parity error signal 427. If the configuration signal 423 indicates a x2 configuration, then the segment address 425 is used to select between the two x2 parity error signals output from OR gates 411 and 412 to drive the block parity error signal 427. If the configuration signal 423 indicates a x4 configuration, the x4 parity error signal output from OR gate 413 is selected to drive the block parity error signal 427. The circuit of FIG. 13 may be modified such that, for the x2 and x4 parity error signals, the outputs of the participating parity check circuits 405 are first logically ORed with one another and then ANDed with a logical OR combination of corresponding validity bits. By this arrangement, only one of the two validity bits for a x2 CAM word needs to be set to perform a complete parity check of the CAM word. A similar logical OR combination of all four parity check circuit outputs may be ANDed with a logical OR combination of all four validity bits to produce the x4 parity error signal. The Boolean expressions for such an arrangement are as follows:

$$x2(S0+S1)=(PCC0+PCC1)*(V0+V1)$$

$$x2(S2+S3)=(PCC2+PCC3)*(V2+V3)$$

$$x4=(PCC0+PCC1+PCC2+PCC3)*(V0+V1+V2+V3),$$
where the '+' symbol represents a logical OR operation, the '*' symbol represents a logical AND operation, V signifies a validity bit and PCC signifies a parity check circuit output.

The circuit of FIG. 13 may alternatively be modified to require that all the validity bits for a given x2 or x4 CAM word be set in order for an error to be signaled. The Boolean expressions for such an arrangement are as follows:

$$x2(S0+S1)=(PCC0+PCC1)*V0*V1$$

$$x2(S2+S3)=(PCC2+PCC3)*V2*V3$$

$$x4=(PCC0+PCC1+PCC2+PCC3)*V0*V1*V2*V3$$

Other logical constructs for generating x2 and x4 parity error signals may be used without departing from the scope of the present invention. Also, numerous additional logical constructs may be used to generate multi-segment parity error signals for a storage block having additional segments or different distributions of validity bits within the storage block.

Still referring to FIG. 13, in an alternative embodiment a row of CAM cells spanning all four segments of the CAM block 381 may be concurrently error checked without regard to the width and depth configuration of the block. In such an embodiment, the multiplexer 421 and logic gates 411 and 412 may be omitted, and the OR gate 413 used to generate the block parity error.

CAM Device with Self-Invalidating Function

Figure 14:
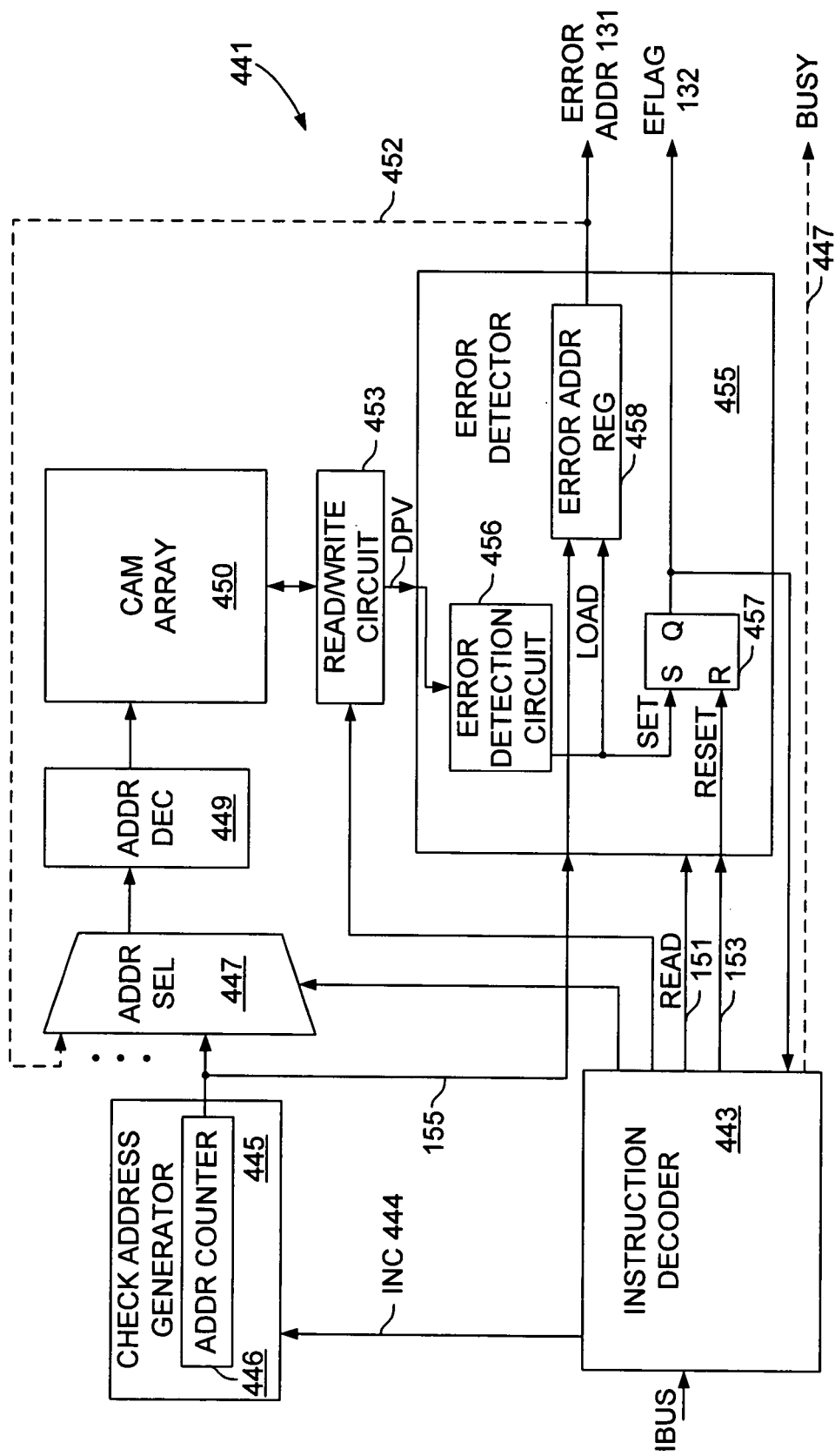
FIG. 14 is a block diagram of a CAM device capable of automatically invalidating a CAM word upon detection of a parity error.

FIG. 14 is a block diagram of a CAM device 441 capable of automatically invalidating a CAM word upon detection of an error. The CAM device 441, referred to as a self-invalidating CAM, includes an instruction decoder 443, check address generator 445, address selector 447, address decoder 449, CAM array 450, read write circuit 453 and error detector 455. Numerous other circuit blocks may be included in the CAM device 441, including circuit blocks shown in the CAM device of FIG. 1, but have been omitted from FIG. 14 in the interest of clarity. The instruction decoder 443, check address generator 445, address selector 447, address decoder 449, CAM array 450, read/write circuit 453 and error detector 455 operate generally in the manner described in reference to the preceding figures (e.g., instruction decoder 105 of FIG. 1; check address generator 124 of FIG. 2; address selector 125 of FIG. 2; address decoder 127 of FIG. 2; CAM array 101 of FIGS. 1 and 5; read/write circuit 161 of FIGS. 1 and 8, and read/write circuit 322 of FIG. 10; and error detector 107 of FIGS. 1, 5, and 6, error detector 287 of FIG. 7, error detector 323 of FIG. 10, and error detector 348 of FIG. 11). More specifically, if the error detection circuit 456 detects a parity error in the CAM word selected for error checking by the check address generator 445, the error flag signal 132 is asserted (e.g., by S-R flip flop 457 or other storage element) and the error address register 458 is loaded with the check address 155. The entries within the error address register 458 are advanced in response to a read signal 151 from the instruction decoder 443 and the error flag signal is deasserted in response to a reset signal 153 from the instruction decoder 443.

As shown, the instruction decoder 443 is coupled to the output of the S-R flip flop 457 and therefore is signaled upon detection of a parity error. If no parity error is signaled, the instruction decoder 443 issues an increment signal 444 to the check address generator 445 which responds by incrementing a counter 446 containing the parity address. If a parity error is signaled, the instruction decoder 443 does not issue the increment signal 444 to the check address generator 445 and the address counter 446 remains pointed at the CAM word which produced the parity error.

Figure 17:
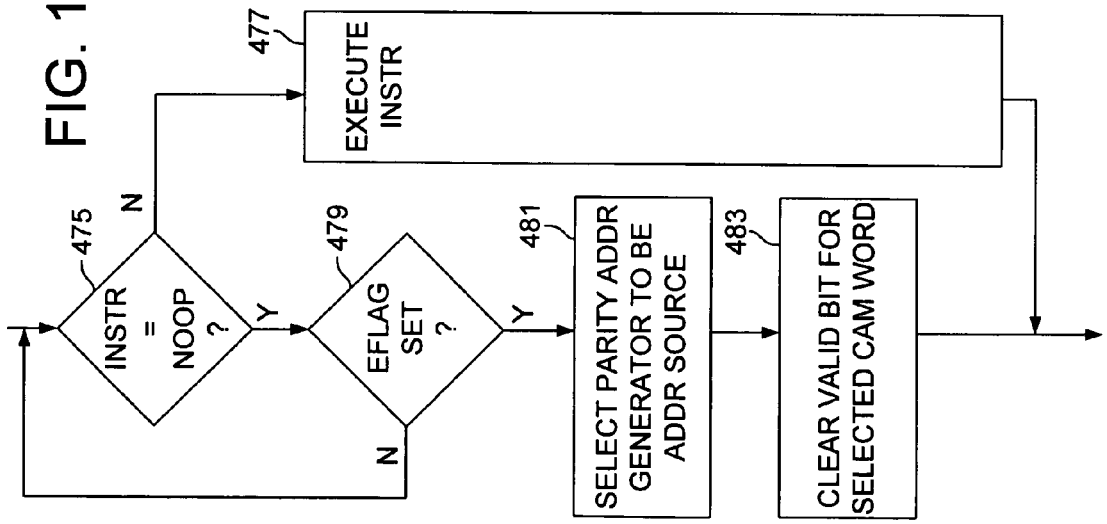
FIG. 17 illustrates the operation of an instruction decoder in a self-invalidation operation.

FIG. 17 illustrates the operation of the instruction decoder 443 (FIG. 14) in a self-invalidation operation. Starting at decision block 475, the instruction decoder monitors the reception of instructions via the IBUS to determine if any no-operation (no-op) instructions are received or if any idle intervals (i.e., no instruction transmission by the host) occur. If instructions requiring read, write or compare operations on the CAM array are received, the instructions are executed as indicated by block 477. On the other hand, if a no-op instruction (or idle interval) is detected at decision block 475, the instruction decoder evaluates the error flag signal at block 479 to determine if the error detector has detected an error in the CAM array. If the error flag is not set, the instruction decoder returns to monitoring the incoming instructions for no-ops and idle intervals. If the error flag is set, then at block 481 the instruction decoder signals the address selector to select the check address generator as the address source for a CAM array access. At block 483 the instruction decoder signals the write circuit to clear the validity bit for the CAM word selected by the address decoder, thereby invalidating the CAM word. The validity bit may be cleared, for example, by a write to the selected CAM word (including the validity bit), or by signaling the validity storage within the CAM array to reset the validity bit for the selected CAM word. Once the validity bit for the CAM word is reset, the CAM word may no longer produce a match result during a compare operation. Accordingly, by performing the self-invalidation operation, false matches due to the corrupted CAM word may be prevented.

Depending on the amount of time required to perform the self-invalidation operation, it may be desirable for the instruction decoder to issue a busy signal (illustrated in FIG. 14 by dashed line 447) to the host processor during a self-invalidation operation to prevent the host processor from issuing instructions that will result in a resource conflict within the CAM device 441 (e.g., host instructions that require read, write or compare operations to be performed on the CAM array). Alternatively, a self-invalidation operation may be aborted to perform a host requested operation in the event of a resource conflict.

Although a self-invalidation operation has been described, the instruction decoder 443 of FIG. 14 may also invalidate a corrupted CAM word in response to an explicit host instruction. In that case, the sequence of operations may similar to those shown in FIG. 17 (i.e., blocks 481 and 483) followed by a signal to the error detector 455 to reset the error flag 132.

Still referring to FIG. 14, if the error address register 458 is a multiple-entry error address register, it may be desirable to access the CAM array (in a self-invalidation operation) using the error address 131 instead of the check address 155. A signal path for this purpose is shown by dashed line 452 in FIG. 14. In this alternative configuration, the error address register may be advanced (e.g., by issuance of read signal 151) after each self-invalidation operation to step through the error addresses logged in the error address register 458. Accordingly, the CAM word for each entry in the error address register 458 may be invalidated in a separate invalidation operation until the error address register is emptied.

Figure 15:
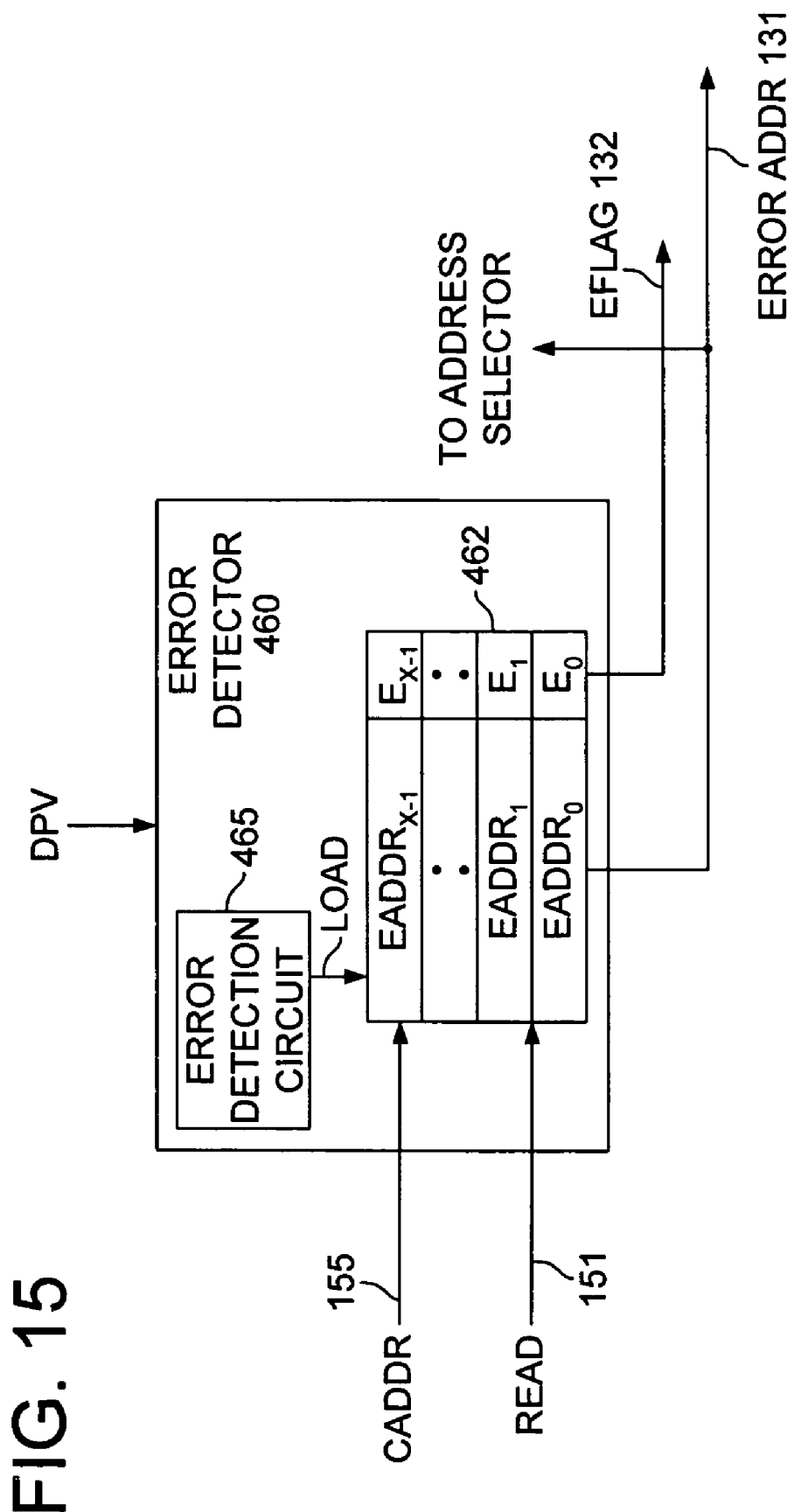
FIG. 15 illustrates an error detector that includes a multiple-entry error address register to support self-invalidation.

FIG. 15 illustrates an error detector 460 that includes a multiple-entry error address register to support self-invalidation. The error detector is similar to the error detector 455 in FIG. 14, except that, in response to a load signal from the error detection circuit 465, an error flag is stored in the error register 462 along with the corresponding check address 155. The error flags are designated $E_0$ to $E_{X-1}$ in FIG. 15. As the entries in the error address register 462 are advanced (e.g., in response to read signal 151) the error flag associated with the new head entry in the error address register 462 is used to provide the error flag signal 132, and the error address at the head entry is used to provide the error address output 131. By this arrangement, the instruction decoder may step through the error address register entries in a sequence of self-invalidation operations until an entry having a reset error flag is reached, signifying that the error address register 462 has been emptied.

In many CAM applications, a backup storage of the CAM array content is maintained to allow the CAM array to be restored in the event of memory loss or corruption. In such applications, self-invalidation of a CAM word may result in loss of coherency (i.e., sameness) between the CAM array and the backup storage. Accordingly, it may be desirable to provide an alternate error storage within a CAM device so that, as the CAM device performs self-invalidation operations to clear errors in the error address register, those same errors remain logged in the alternate error storage. The host may then access the alternate error storage from time to time to determine whether errors have occurred and, if so, take appropriate actions to maintain coherency between the CAM array and the backup storage, and restore any invalidated CAM words. In one embodiment, the alternate storage is substantially identical to the error address register (and loaded at the same time) except that a self-invalidate indicator is included in each entry. The self-invalidate indicator is initially reset when an error is logged, but then set if an invalidate operation takes place at the logged error address. In an alternate embodiment, no such self-invalidate indicator is maintained.

Error Correction Code—CAM Device with Self-Correcting Function

Figure 16:
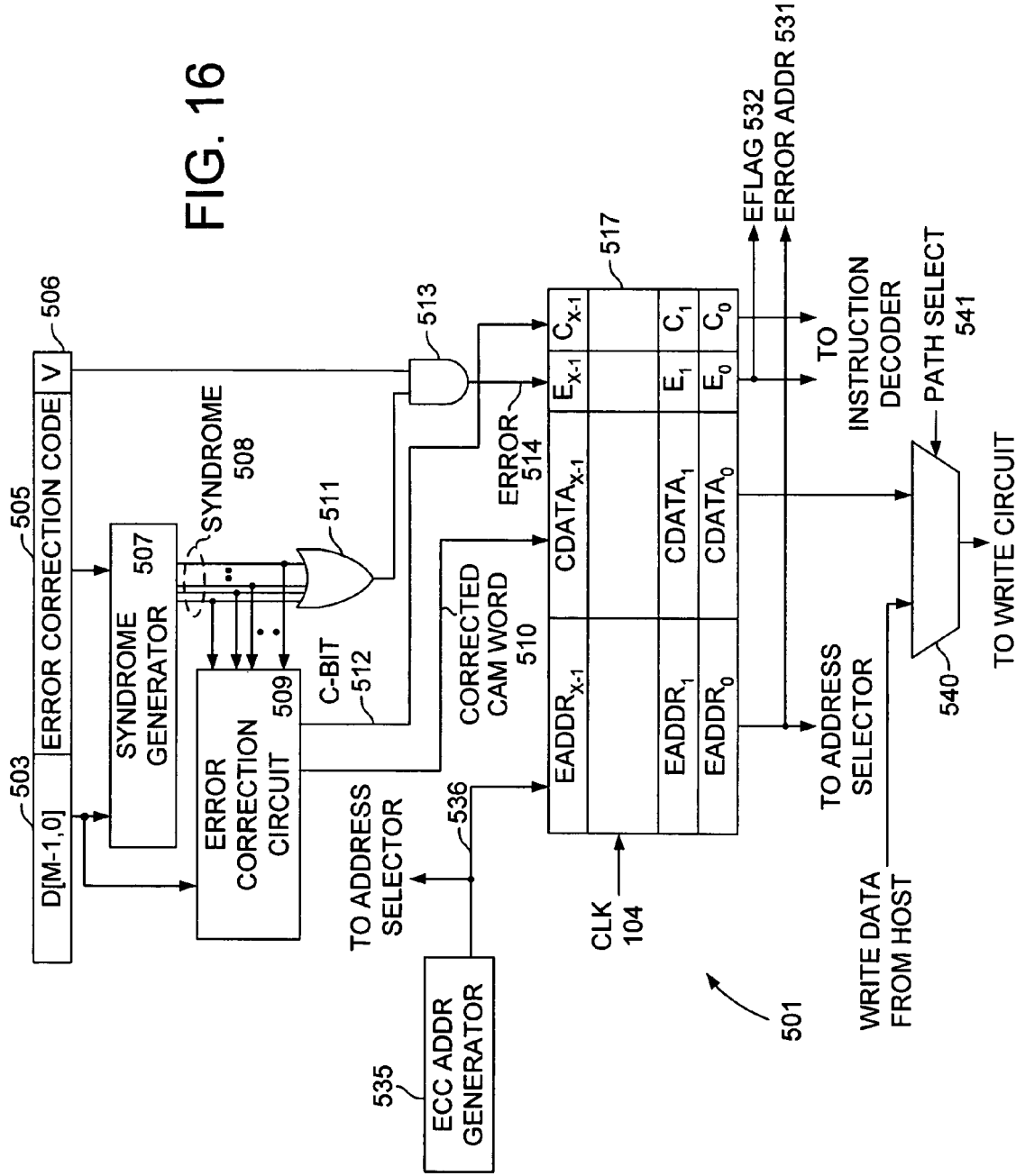
FIG. 16 illustrates an alternative error detector 501 that operates on an error correction code instead of a parity bit.

Thus far, error checking has been described primarily in terms of parity checking. FIG. 16 illustrates an alternative error detector 501 that operates on an error correction code stored with the CAM word instead of a parity bit. Error correction codes (e.g., Hamming codes) are sequences of bits formed, for example, by generating parity values for overlapping groups of bits within the CAM word. The chief advantage of error correction codes (ECCs) is that they permit location and therefore correction of a single bit error within a data value. ECCs also permit detection of two-bit errors within a data value; errors that typically will not be detected by a parity-checking scheme because the two errors cancel one another insofar as they contribute to the even/odd parity of the data value.

As shown in FIG. 16, a CAM word 503 and corresponding ECC 505, which together form a codeword, are supplied to a circuit called a syndrome generator 507. The syndrome generator 507 effectively multiplies the codeword with a parity check matrix (e.g., a Hamming matrix) to generate a parity check vector called a syndrome 508. In one embodiment, any nonzero bit in the syndrome 508 indicates that an error has occurred. Accordingly, the individual bits of the syndrome 508 are logically ORed in gate 511 to determine if the CAM word 503 has an error.

The output of OR gate 511 is then gated by the validity bit 506 for the CAM word 503 in AND gate 513 to generate an error signal 514. The error signal 514 is applied to the load input of an error address register 517 to cause the error address register 517 to be loaded with an error address 536 at the next transition of CLK 104. An ECC address generator 535 is used to address the CAM array for error detection purposes and also to supply the error address 536 to the error address register 517.

The syndrome 508 is additionally supplied to an error correction circuit 509 along with the CAM word 503. If the syndrome is nonzero (indicating an error), and a single bit error has occurred, the error correction circuit 509 generates a corrected CAM word 510. In one embodiment, the corrected CAM word 510 is generated by identifying a column of bits in the parity check matrix that matches the bit pattern of the syndrome 508. The position of the matching column within the parity check matrix (i.e., first column, second column, etc.) corresponds to the position of the bit in error within the CAM word 503. The bit in error is then flipped (i.e., inverted) by the error correction circuit 509 to produce the corrected CAM word 510. As shown in FIG. 16, the corrected CAM word 510 is supplied to the error address register 517 for storage in a corrected data array (CDATA).

If the syndrome 508 does not match one of the columns of the parity check matrix corresponding to a single bit error, a multi-bit error has occurred and CAM word output from the error correction circuit 509 is not a corrected CAM word. Accordingly, a signal to indicate whether the CAM word 503 has been corrected, called a C bit 512, is output from the error correction circuit 509 along with the CAM word 510. If a single-bit error has been detected and corrected, the C bit 512 is set to indicate that the CAM word 510 has been error corrected by the error correction circuit 509. If a multi-bit error has been detected, the C bit 512 is reset to indicate that the CAM word 510 has not been error corrected. In the embodiment of FIG. 16, the C bit 512 is loaded into the error address register 517 along with the CAM word 510, the error signal 514 and the error address 536.

Still referring to FIG. 16, the error bit and error address in the head entry of the error address register 517 are used to produce the error address 531 and error flag signal 532. These signals may be used to support background error checking and self-invalidation operations as described above. The storage of the corrected CAM words 510 and C bits 512 further enables a CAM device to perform a self-correction operation in which a corrupted CAM word within the CAM array is overwritten with a corrected CAM word from the error address register 517. More specifically, a write data multiplexer 540 is provided to select, in response to a path select signal 541 from the instruction decoder, either host-supplied data or a corrected CAM word from the error address register to be supplied to the write circuit. Also, the C bit at the head entry of the error address register 517 is provided to the instruction decoder to notify the instruction decoder that a corrected CAM word is available for use in a self-correction operation. In a self-correction operation, the write data multiplexer 540 outputs a corrected CAM word to the write circuit and the error address 531 is supplied to the address selector (not shown) to address the appropriate entry within the CAM array.

Figure 18:
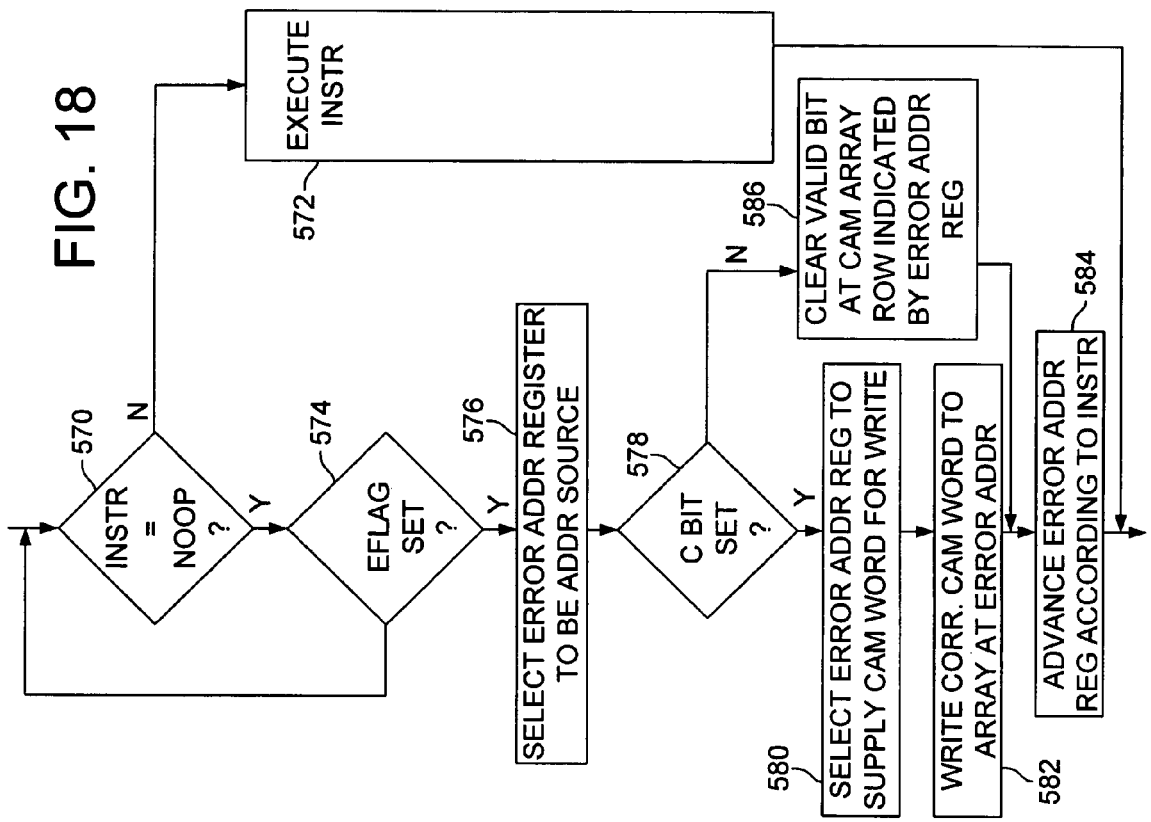
FIG. 18 illustrates the operation of an instruction decoder in a self-correction operation.

FIG. 18 illustrates the operation of an instruction decoder in a self-correction operation.

As with the self-invalidation operation, the instruction decoder monitors incoming host instructions in decision block 570 to determine whether a no-op instruction is received or if any idle intervals occur. If instructions requiring read, write or compare operations on the CAM array are received, the instructions are executed as indicated by block 572. If a no-op instruction (or idle interval) is detected at decision block 570, the instruction decoder evaluates the error flag signal at block 574 to determine if the error detector has detected an error in the CAM array. If the error flag is not set, the instruction decoder returns to decision block 570 to monitor the incoming instructions for no-ops and idle intervals. If the error flag is set, then at block 576 the instruction decoder signals the address selector to select the error address output by the error address register as the address source for a CAM array access. If the instruction decoder determines the C bit to be set at decision block 578, the instruction decoder signals the write data multiplexer at block 580 to select the error address register to supply a corrected CAM word for a write operation. Subsequently, at block 582, the instruction decoder signals the write circuit to write the corrected CAM word to the CAM array at the error address. Finally, at block 584, the instruction decoder signals the error address register to advance to the next entry. Returning to decision block 578, if the C bit is not set, the instruction decoder may perform a self-invalidate operation prior to signaling the error address register to advance. For example, as shown in block 586, the instruction decoder may signal the write circuit to clear the validity bit for the CAM word indicated by the error address, thereby invalidating the CAM word within the CAM array.

As with the self-invalidation operation, it may be desirable for the instruction decoder to issue a busy signal to the host processor during a self-correction operation to prevent the host processor from issuing instructions that may result in a resource conflict within the CAM array (e.g., host instructions that require read, write or compare operations to be performed on the CAM array). This signal is indicated by dashed line 447 in FIG. 14. Also, as with the self-invalidation operation, the self-correction operation may be aborted to avoid delaying execution of host instructions. Further, it may be desirable to provide an alternate error storage as described above so that, as the CAM device performs self-correction and self-invalidation operations to clear errors in the error address register, those same errors remain logged in the alternate error storage. The host may then access the alternate error storage from time to time to determine whether errors have occurred and, if so, take appropriate actions to maintain coherency between the CAM array and the backup storage, and restore any invalidated CAM words.

Generating a Sequence of Error Check Addresses

Figure 19:
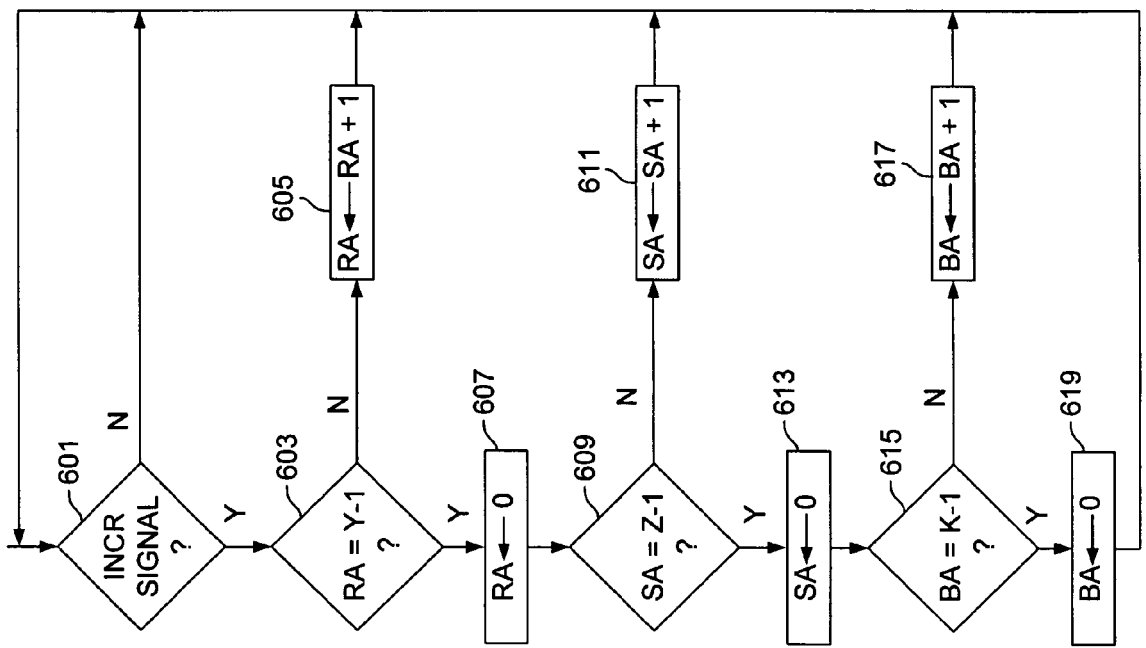
FIG. 19 illustrates the increment operation within an address generator used to generate a sequence of error check addresses.

FIG. 19 illustrates the increment operation within an address generator used to generate a sequence of error check addresses including, without limitation, the parity addresses and ECC addresses described above. In one embodiment, the error check address is formed by three address components: a block address, a segment address, and a row address. The block address is used to select one of a plurality of storage blocks, the segment address is used to select one of a plurality of segments within the selected storage block and the row address is used to select, within the selected segment, the row containing the CAM word (or partial CAM word) to be error checked. The block address component of the error check address may be omitted in a CAM device that includes only a single storage block, and the segment address component may likewise be omitted in a CAM device that has only one segment per storage block.

For the purpose of the present description, the address generator is assumed to be implemented in a CAM device having K storage blocks, each containing Z segments that are Y rows deep. Thus, the block address ranges from 0 to K−1, the segment address ranges from 0 to Z−1 and the row address ranges from 0 to Y−1.

Referring now to decision block 601, if an increment signal is detected, the row address (RA) of the error check address is evaluated in decision block 603 to determine if the row address has reached the row limit (i.e., the final row address, Y−1). This may be accomplished, for example, by a comparison of the row address and row limit in a comparator. Other techniques and circuits may also be used to detect when the row limit has been reached.

If the row address has not reached the row limit, the row address is incremented by one in block 605 to complete the increment operation. If the row address has reached the row limit, the row address is reset to zero in block 607, followed by evaluation of the segment address (SA) in decision block 609 to determine if the segment address has reached the segment limit (i.e., Z−1). If the segment address has not reached the segment limit, the segment address is incremented by one in block 611 to complete the increment operation. If the segment address has reached the segment limit, the segment address is reset to zero in block 613, followed by evaluation of the block address (BA) in decision block 615 to determine if the block address has reached the block limit (i.e., K−1). If the block address has not reached the block limit, the block address is incremented by one in block 617 to complete the increment operation. If the block address has reached the block limit, the block address is reset to zero in block 619 to complete the increment operation.

The increment operation may be changed in numerous ways in alternative embodiments. For example, in the increment operation described above, the row address is effectively treated as the least significant component of the error check address, followed by the segment address and then the block address. Any order of significance may be assigned to the row, segment and block addresses in alternative embodiments. For example, the block address may be incremented from 0 to K−1 before either the segment or row addresses are incremented, or the segment address may be incremented from 0 to Z−1 before either the block or row addresses are incremented.

In another implementation of the increment operation, one or more of the components of the error check address may be incremented by values other than one. For example, assuming Y is even, the row address component may be incremented by any odd value with modulo Y arithmetic being used to calculate the result (the decision block 603 of FIG. 19 may be modified, for example, to test for RA=Y−1−i, where i is the increment value). Also, the increment may be negative instead of positive such that the address components are counted down instead of up. Finally, the increment operation described in reference to FIG. 19 is used to separately address each row of each segment of each block.

In alternative embodiments, the each segment of a given block may be accessed together to concurrently error check all the segments for a given row address component; or each segment within each of the blocks may be accessed together to concurrently error check the same row across all segments and all blocks. In yet another embodiment, the segment address may be incremented by a selectable amount according to the configuration of the corresponding storage block. For example, if the storage block is configured for a x2 CAM word, the segment address may be incremented by two instead of one in block 611 of FIG. 19.

Priority-Biased Error Detection Sequencing

FIG. 23 illustrates a counter 700 that may be used to generate a linear sequence of error check addresses within a CAM device. The counter 700 maintains an internal count value which is output as the check address 155 described above and which is incremented (or decremented) by a predetermined value in response to a rising (or falling) edge of an enable signal 126 at a strobe input of the counter 700. When a final count is reached, the count value, and therefore the check address, is rolled over to an initial value to repeat the sequence. Because the resulting check address sequence (referred to herein as an error detection sequence or error scan sequence) is linear, each CAM array location is checked for error at the same frequency (at least on average) as any other of the CAM array locations, in effect treating all the CAM array locations as being of equal significance. In some cases, however, the CAM array locations may not be of equal significance, but rather may be loaded with CAM words and treated in compare operations in a prioritized manner according to a predetermined or host-specified prioritization policy. In general, higher priority storage locations are more likely to contain a corrupted CAM word than lower priority locations, because higher priority storage locations are typically loaded with CAM words before lower priority storage locations. Higher priority storage locations are also more likely to produce a corrupted match index, because if two storage locations contain a comparand-matching CAM word, the match index (e.g., signal 174 of FIG. 1) will typically reflect the higher priority location. Accordingly, corruption of a CAM word at a higher priority storage location is statistically more likely to result in incorrect packet forwarding or classification.

In view of the foregoing, it may be desirable to generate an error scan sequence that is biased toward higher priority storage locations within a CAM array such that the higher priority storage locations are more frequently error checked than lower priority storage locations. Such a priority-biased error scan sequence may result in error checking that is more proportional to the likelihood and severity of errors in different storage locations within the CAM array.

FIG. 24 illustrates an embodiment of an address generator 720 for generating an error scan sequence that is biased toward lower ordered address values. The address generator 720 includes an address counter 721, limit counter 723, compare circuit 725 and flip-flop 727. The address counter 721 maintains an address count that includes at least $\log_2 N$ constituent bits, N being the number of independently addressable storage locations within a CAM array (or CAM block) to be error checked. The address count is output to a first input of the compare circuit 725, and is also output as the check address 155 discussed above. The address counter 721 includes a strobe input coupled to receive an enable signal 126 (e.g., from an instruction decoder as shown in FIG. 1, from another circuit block within a CAM device, or from an external source) and a reset input (RST) coupled to receive a match signal 722 from compare circuit 725. The address counter 721 increments the address count by one in response to a rising edge of the enable signal 126, and resets the address count to an initial address count (e.g., zero, N−1, etc.), if the match signal 722 is high when a rising edge of the enable signal 126 occurs. The address counter 721 may be designed to self-initialize the address count to the initial address count during device initialization (e.g., power-up), or may initialize the initial address count in response to a system reset signal. For example, the match signal 722 may be logically ORed with reset signal 153, described above in reference to FIG. 1, and the resulting signal provided to the reset input (RST) of address counter 721. Alternatively, reset signal 153 may be provided to another reset input of the address counter 721.

The limit counter 723 maintains a limit count that also includes at least $\log_2 N$ constituent bits, and which is output to a second input of the compare circuit 725. The limit counter 723 includes a strobe input coupled to receive a delayed match signal 726 from the flip-flop 727, and may also have a reset input (not shown in FIG. 24) to receive a reset signal (e.g., reset signal 153 described above in reference to FIG. 1) to reset the limit counter to an initial limit count (e.g., zero, N−1, etc.). Alternatively, the limit counter 727 may include circuitry to self-initialize the limit count to the initial limit count. In the embodiment of FIG. 24, the limit counter 723 is a modulo counter that increments the limit count by one in response to each rising edge of the delayed match signal 726 until a final limit count is reached (e.g., N−1, zero, etc.), then rolls over to the initial limit count.

The compare circuit 725 compares the address count and limit count to determine whether the counts are equal and, if so, asserts the match signal 722 (e.g., outputs a logic high level match signal). The match signal 722 is input to the reset input of the address counter as described above, and is also provided to a data input of the flip-flop 727. A strobe input of the flip-flop 727 is coupled to receive the enable signal 126, so that, at each rising edge of the enable signal 126, the state of the match signal 722 is captured at the output of the flip-flop 727 to produce the delayed match signal 726.

Assuming, as an example, that the address count and limit count have each been reset to an initial count of zero, the initial check address 155 will be zero. The compare circuit 725, receiving equal address and limit counts from the address and limit counters, respectively, will assert the match signal 722 (i.e., output a logic high match signal in this example). Consequently, at the next rising edge of the enable signal 126, the address counter will be reset (so that the zero cycle is repeated) and the delayed match signal 726 will transition from low to high, thereby incrementing the limit count from zero to one.

After the limit count is incremented, the match signal 722 will be deasserted (i.e., logic low in this example) because the address count and limit count are no longer equal (i.e., address count=0; limit count=1). Consequently, at the next rising edge of the enable signal 126, the address counter 721 will be incremented from zero to one, and the delayed match signal 726 will go low. Because the address count and limit count are now equal again (address count=1; limit count=1), the match signal 722 will be reasserted and, at the next rising edge of the enable signal 126, the delayed match signal 726 will go high, incrementing the limit count to two, and resetting the address count to zero. Because the address count and limit count are no longer equal (address count=0; limit count=2), the match signal will again be deasserted.

Consequently, at the next rising edge of the enable signal 126, the address count will be incremented from zero to one, and the delayed match signal will go low. Because the address count and limit count are still unequal after the address count is incremented (address count=1; limit count=2), the match signal will remain deasserted so that, at the next rising edge of the enable signal 126, the address count will be incremented from one to two. After the address count is incremented to two, the address count and limit count are equal and the match signal 722 will be reasserted. Accordingly, at the next rising edge of the enable signal 126, the address count will be reset and the limit count will be incremented to three.

Considering the sequence of check address described thus far, it can be seen that the number of successive address increment cycles (i.e., rising edge of the enable signal that results in the address count being incremented) increases by one after each reset cycle (i.e., rising edge of the enable signal that results in the address count being reset and the limit count incremented). That is, the address count reaches a progressively higher value after each reset cycle, generating the following sequence of check addresses:

| | |
|---|---|
| 0, | (Reset cycle 1) |
| 0, 1, | (Reset cycle 2) |
| 0, 1, 2, | (Reset cycle 3) |
| 0, 1, 2, 3, | (Reset cycle 4) |
| ... | |
| 0, 1, 2, 3, . . .N−2 | (Reset cycle N−1) |
| 0, 1, 2, 3, . . .N−1 | (Reset cycle N) |

After the limit count and address count both reach N−1, the error scan sequence is completed and a final reset cycle (the Nth reset cycle) takes place to reset the address count to zero and roll the limit count over to zero. Thus, after the final reset cycle, the address generator 720 is returned to its initial state to repeat the entire error scan sequence.

Reflecting on the number of times a given storage location is checked for error during each complete iteration of the error scan sequence, it can be seen that the zero$^{th}$ storage location (i.e., location within the CAM array that corresponds to address value zero) is tested N times per error scan, the first storage location is tested N−1 times per error scan, the second storage location is tested N−2 times per error scan, and so forth to the N−1 storage location which is tested one time per error scan. Thus, the error scan sequence is biased toward the low order storage locations (i.e., storage locations having low address values), with the zero$^{th}$ storage location being error checked most frequently (once for every (N+1)/2 error checks, on average) and the Nth storage location being error checked least frequently (once for every N(N+1)/2 error checks). Accordingly, if low order storage locations within a CAM array are given higher priority than higher ordered storage locations, the check address generator of FIG. 24 may be used to bias the error scan sequence accordingly. That is, using the check address generator of FIG. 24, higher priority storage locations are error checked more frequently than lower priority storage locations.

Numerous changes may be made to the check address generator of FIG. 24 without departing from the spirit and scope of the present invention. For example, instead of counting up, the limit counter and the address counter may count down. In such an embodiment, the higher valued addresses will be checked at a higher frequency than the lower valued addresses. For example, if the limit counter and the address counter each have an initial count value of N−1, then the error scan sequence will be as follows:

| | |
|---|---|
| N−1 | (Reset cycle 1) |
| N−1, N−2, | (Reset cycle 2) |
| N−1, N−2, N−3, | (Reset cycle 3) |
| ... | |
| N−1, N−2, N−3, . . ., 1 | (Reset cycle N−1) |
| N−1, N−2, N−3, . . ., 0 | (Reset cycle N) |

Accordingly, the N−1 storage location (i.e., location within the CAM array that corresponds to address value N−1) is tested N times per error scan, the N−2 storage location is tested N−2 times per error scan, the N−3 storage location is tested N−2 times per error scan, and so forth to the zero$^{th}$ storage location which is tested one time per error scan. Thus, the error scan sequence is biased toward the high order storage locations and may be useful, therefore, when high order storage locations within a CAM array are given higher priority than low order storage locations.

The address generator of FIG. 24 may also be modified by changing the amount by which the limit count and/or address count is incremented in response to assertion of the delayed match signal 726. For example, the total number of error check address per error scan sequence may be reduced by incrementing the limit count by a number greater than one (or less than negative one). Also, the initial limit count and/or address count may be any number (e.g., the initial limit count may be greater than zero to prevent error checking the zero$^{th}$ storage location twice in succession). Further, the address counter 721 and/or the limit counter 723 may be falling edge triggered rather than rising edge triggered. Also, in alternative embodiments, compare circuit 725 may compare the address count and limit count for inequality (i.e., address count greater than/less than limit count) rather than for equality. In yet other embodiments, signals having active logic states opposite those described in reference to FIG. 24 may be used.

FIG. 25 illustrates an embodiment of the compare circuit 725 of FIG. 24. The compare circuit 725 includes a plurality of exclusive NOR gates 728, each to compare a respective bit of the check address 155(0)–155(N−1) with a corresponding bit of the limit count 724(0)–724(N−1). The output of each exclusive NOR gate 728 is provided to a logic AND gate 729. Each exclusive NOR gate 728 outputs a logic high signal if the input check address bit and corresponding limit count bit match, and low if the bits do not match. Accordingly, if the check address matches the limit count bit for bit, the outputs of all the exclusive NOR gates 728 will be high and will therefore enable the logic AND gate 729 to assert (i.e., drive to a high logic level in this example) the match signal 722. Conversely, if any bit of the check address does not match the corresponding bit of the limit count, the exclusive NOR gate 728 that receives the mismatched bits will output a logic low signal, thereby causing the logic AND gate 729 to deassert the match signal 722.

FIG. 26 illustrates an address generator 730 that may be used to generate a biased sequence of row addresses 736 and a linear sequence of block addresses 738. The row addresses 736 may constitute, for example, the row and segment address components of a sequence of check addresses output by the check address generator 383 of FIG. 12. The block addresses 738 may constitute the block select components of the sequence of check addresses output by the check address generator 383 of FIG. 12. The check address generator 730 includes a row address counter 731, limit counter 733, compare circuit 739, flip-flop 727 and block address counter 735. The row address counter 731, limit counter 733, compare circuit 739 and flip-flop 727 operate in the same manner as the address counter, limit counter, compare circuit and flip-flop components of address generator 720 (described above in reference to FIG. 24) to generate a sequence of row addresses 736 that are biased toward low order address values. The row address counter 731 is similar to the address counter 723 described in reference to FIG. 24, except that, upon reaching a final count value (e.g., N–1), the address counter 731 asserts a terminal count signal 734 (i.e., outputs a logic high level terminal count signal 734). The block address counter 735 responds to assertion of the terminal count signal 734 by incrementing a block address count, thereby incrementing the block address 738. Thus, the block address counter 735 increments the block address after each completed error scan sequence (i.e., after the row address reaches N–1) so that the biased error scan sequence is repeated for the next CAM block. The resulting sequence of block addresses 738 is a linear sequence, 0, 1, 2, . . . , K–1, where K is the number of blocks in the CAM device. The block address count rolls over to an initial value (e.g., zero) after reaching the final count of K–1.

The row addresses 736 and the block addresses 738 may be coupled to address decoder 127 shown in FIG. 2 to access rows in a CAM array block and CAM array blocks, respectively. For one embodiment, address decoder 127 includes one or more row decoders and a block decoder. Each row decoder is coupled to one or more corresponding CAM array blocks to access rows therein in response to the row addresses, and the block decoder accesses or selects particular blocks or row decoders based on the block addresses.

As discussed above in reference to FIG. 24, numerous changes may be made to the address generator 730 without departing from the spirit and scope of the present invention. For example, the row address counter 731 and/or block address counter 735 may generate a descending rather than ascending sequence of check addresses (e.g., by counting down rather than up), and the counters 731, 733, 735 (or any one of them) may increment their respective count values in response to a falling rather than rising strobe signal edge. Different increment values and/or initial values may be used within the row address counter 731, limit counter 733 and/or block address counter 735. Also, the compare circuit 739 may compare the row address count and limit count for inequality rather than equality.

FIG. 27 illustrates an alternate embodiment of an address generator 740 for generating a biased sequence of row addresses and a linear sequence of block addresses. Address generator 740 includes a row address counter 741, limit counter 733, compare circuit 739, flip-flop 727 and block address counter 737. The row address counter 741, limit counter 733, compare circuit 739 and flip-flop 727 operate in the same manner as the address counter, limit counter, compare circuit and flip-flop components of address generator 720 (described above in reference to FIG. 24) to generate a biased sequence of row addresses 736. Instead of receiving enable signal 126 at its strobe input, however, address counter 741 receives a terminal count signal 744 from block address counter 737. The block address counter 737 receives the enable signal 126 at its strobe input and generates a linear sequence of block addresses 0, 1, 2, . . . , K–1, where K is the number of CAM blocks in the CAM device. Thus, address generator 740 operates similarly to the address generator 730 of FIG. 26, except that, instead of incrementing the block address once per each completion of an entire row address scan (i.e., 0, 0, 1, 0, 1, 2 . . . , N–1) the row address is incremented once per each completion of an entire block address scan (0, 1, 2, . . . , K–1). That is, each row address in the error scan sequence is used to error check the corresponding storage location within each of the CAM blocks before the row address is incremented.

Figure 28:
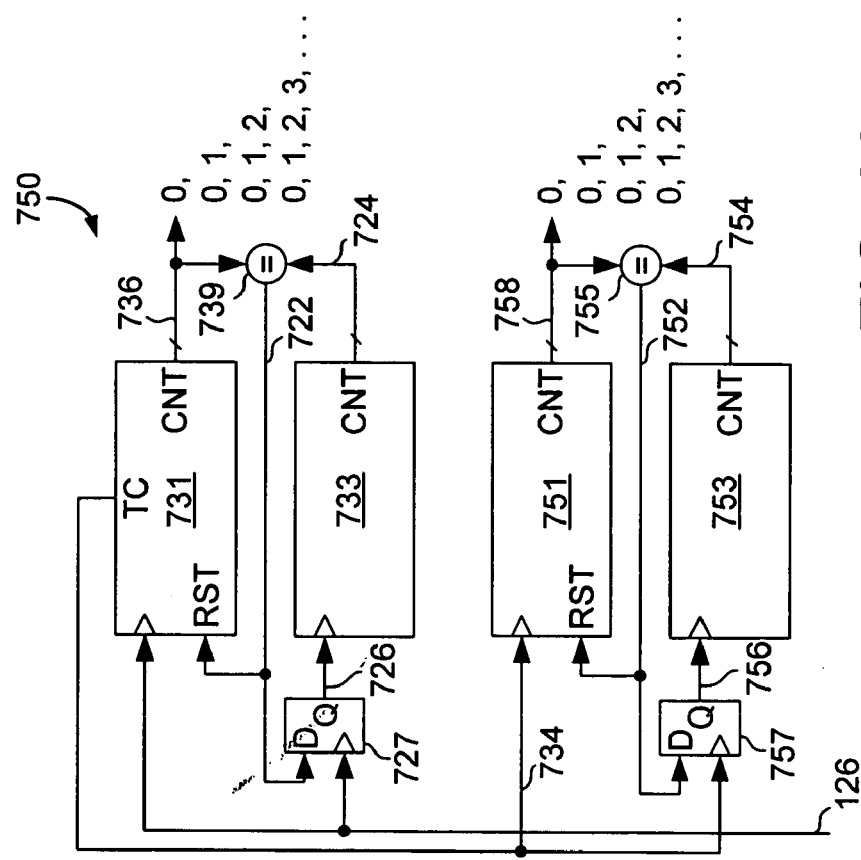
FIG. 28 illustrates an embodiment of an address generator that can be used to generate a biased sequence of row addresses and a biased sequence of block addresses.

FIG. 28 illustrates an embodiment of an address generator 750 that can be used to generate a biased sequence of row addresses 736 and a biased sequence of block addresses 758. The check address generator 750 includes a row address counter 731, row limit counter 733, compare circuit 739, flip-flop 727, block address counter 751, block limit counter 753, compare circuit 755 and flip-flop 757. The row address counter 731, row limit counter 733, compare circuit 739, and flip-flop 727 operate as described above in reference to FIG. 26 to generate a biased sequence of row addresses, and to assert a terminal count signal 734 when the row address count reaches a terminal count (e.g., N–1). The block address counter 751, block limit counter 753, compare circuit 755 and flip-flop 757 form a block address generation circuit that operates in the same manner as the row address generation circuit (i.e., comparing the block address count 758 to the block limit count 754 and, when the counts match, generating block match signal 752 and delayed block match signal 756) to generate a biased sequence of block addresses (0, 0, 1, 0, 1, 2, . . . , K–1). The block address generation circuit differs from the row address circuit only insofar as the source of the count strobe signal (the block address count is incremented in response to assertion of the terminal count signal 734, while the row address count is incremented in response to assertion of the enable signal 126), and the final count value (the block limit counter 753 is a modulo counter that rolls over to an initial block address count after reaching a final block address count of K–1).

In the embodiment of FIG. 28, the row address count is incremented through a complete error scan sequence before the block address is generated. Alternatively, the block address counter 751 may be incremented by the enable signal 126 and provide a terminal count signal to the strobe input of the row address counter 731. In such an embodiment, the biased block address sequence is completed for each row address before the row address is incremented.

As with the address generator 740, the check addresses 736 and the block address 738 generated by address generator 750 may be coupled to address decoder 127 shown in FIG. 2 to access rows in a CAM array block and CAM array blocks, respectively. For one embodiment address decoder 127 includes one or more row decoders and a block decoder. Each row decoder is coupled to one or more corresponding CAM array blocks to access rows therein in response to the check addresses, and the block decoder accesses or selects particular blocks or row decoders based on the block addresses. As with address generators 720, 730 and 740 (described above in reference to FIGS. 24, 26 and 27, respectively), numerous changes may be made to the check address generator 750 of FIG. 28. For example, the row address and/or block address may be generated in a descending, rather than ascending order. The counters 731, 733, 751, 753 (or any one of them), may increment in response to a falling edge, rather than rising edge signal, and may increment their respective counts by values greater than one (or less than negative one). The initial values and increment values may be any number. The compare circuits 725 and/or 755 may compare for inequality (i.e., row address and/or block address greater than their respective limit counts) instead of equality.

Note that in the address generators 730, 740 and 750 (described in reference to FIGS. 26, 27 and 28, respectively), the row address may include a segment address component. Alternatively, an additional circuit may be provided to generate a linear or biased segment address. For example, the address generator 730 of FIG. 26 may include an additional counter (i.e., a segment address counter, not shown) which is clocked by the terminal count signal 734 to generate an ascending or descending linear sequence of segment addresses. The segment address counter may itself output a terminal count signal to the block address counter 735 upon reaching a final count value in the segment address sequence. Alternatively, the block address counter may be clocked by the terminal count signal 734 as shown, and output a terminal count signal to the segment address counter. Further, the segment address counter may be first in line, receiving the enable signal 126 at a strobe input, then outputting a terminal count signal to clock the row address counter 731.

A segment address counter may also be used in the address generator 740 of FIG. 27 either first in line (being clocked by the enable signal 126 and outputting a terminal count signal to the block address counter 737), second in line (receiving the terminal count signal 744 from the block address counter and outputting a terminal count signal to the row address counter 741), or last in line (receiving a terminal count signal from the row address counter 741).

A segment address counter may also be used within the address generator 750 of FIG. 28 either first in line (being clocked by the enable signal 126 and outputting a terminal count signal to the row address counter 731), second in line (receiving the terminal count signal 734 from the row address counter 731 and outputting a terminal count signal to the block address counter 751) or last in line (receiving a terminal count signal from the block address counter 751). The segment address counter may also be used first, second or last in line when the increment order is switched between the row address and block address counters (i.e., as discussed above by proving a count signal (e.g., enable signal 126) to the block address counter 751 and using a terminal count output of the block address counter 751 to clock the row address counter 731).

In any circuit that includes a dedicated segment address counter, the segment address counter may be a linear counter that counts up or down by any increment and that counts from any initial value to any final value. Also, a segment limit counter may be provided so that the segment address counter outputs a biased sequence of segment addresses.

Figure 29:
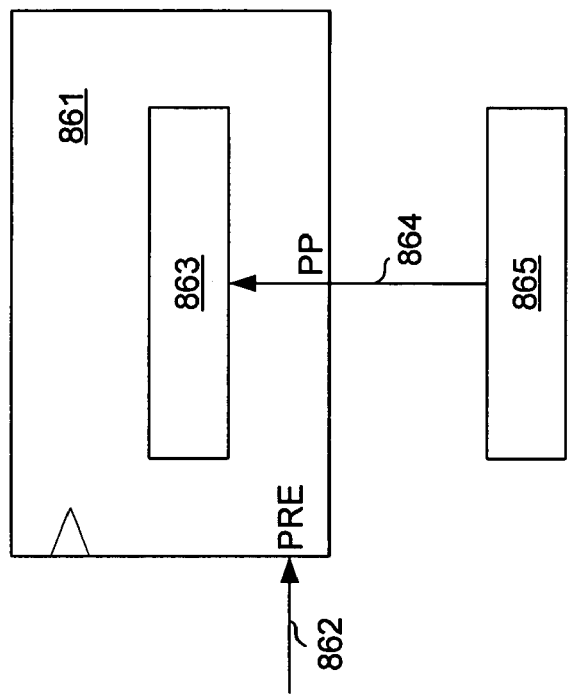
FIG. 29 illustrates a preloadable counter circuit according to one embodiment.

In each of address generators 720, 730, 740, 750, it may be desirable to allow a starting address count and/or starting limit count to be programmed at run-time or set during device production. FIG. 29 illustrates a preloadable counter circuit 861 that may be used to implement any of the address counters and/or limit counters described herein. As shown, the counter circuit 861 includes a count memory 863, preload strobe input (PRE), a preload port (PP) and count strobe input (designated by the symbol '>'). When a reset signal 862 is asserted (i.e., during a roll over event), a start count 864 received via the preload port is loaded into the count memory. In one embodiment, the start count 864 is provided from a programmable register 865 that is included within a CAM device along with counter 861. The programmable register 865 may be programmed with the start count 861 by a host processor or other external device (e.g., as described in reference to FIG. 20, below) during a run-time configuration operation. For example, a host processor or other external device may issue an instruction that includes an operation code and operand (e.g., operand=start address) to program the start count. Alternatively, the programmable register 865 may be a non-volatile storage or one-time programmable device that is programmed, for example, during a production-time programming operation to select a start count for the counter circuit 861. The programmable register 865 may be included within the counter circuit 861 in an alternative embodiment. Note that the programmable register 865 may also (or alternatively) be programmed with an increment value that is supplied to the counter circuit 861 to enable the counter to be incremented by a programmable increment (positive or negative) in response to a strobe signal transition. Further, the programmable register 865 may be programmed with a final count value that is supplied to the counter circuit 861 to control the count value at which the count value maintained by the counter circuit 861 rolls over and, if necessary, the count value at which the counter circuit 861 generates a terminal count signal. Separate programmable registers may also be provided to supply the start count, increment value, and/or final count to the counter circuit 861.

Embodiment without Validity Bits

Each of the CAM device embodiments described thus far have included validity bits to indicate whether corresponding CAM words are valid and to gate the error flag signal accordingly. In alternative embodiments the validity bit storage may be omitted from the CAM device and the gating circuitry (e.g., element 222 of FIGS. 6 and 7, element 398 of FIG. 12, element 407 of FIG. 13, and element 513 of FIG. 16) omitted from the error detector. In one embodiment, for example, each of the rows of CAM cells may initially be filled with a default value (e.g., all '0's) and the parity bit (or bits) or other error check values for the row set accordingly. By this arrangement, all CAM words in the CAM array are effectively 'valid' in that known values together with appropriate error checking values have been stored in each of the rows of CAM cells. Accordingly, the error checking embodiments described herein may be modified by removing the validity-based gating circuitry (e.g., element 222 of FIGS. 6 and 7, element 398 of FIG. 12, element 407 of FIG. 13, and element 513 of FIG. 16), and then using the remaining circuitry to detect and log errors, and to perform self-correction operations. Self-invalidation operations may effectively be performed by resetting a corrupted CAM word to the default value.

System Structure and Operation

Figure 20:
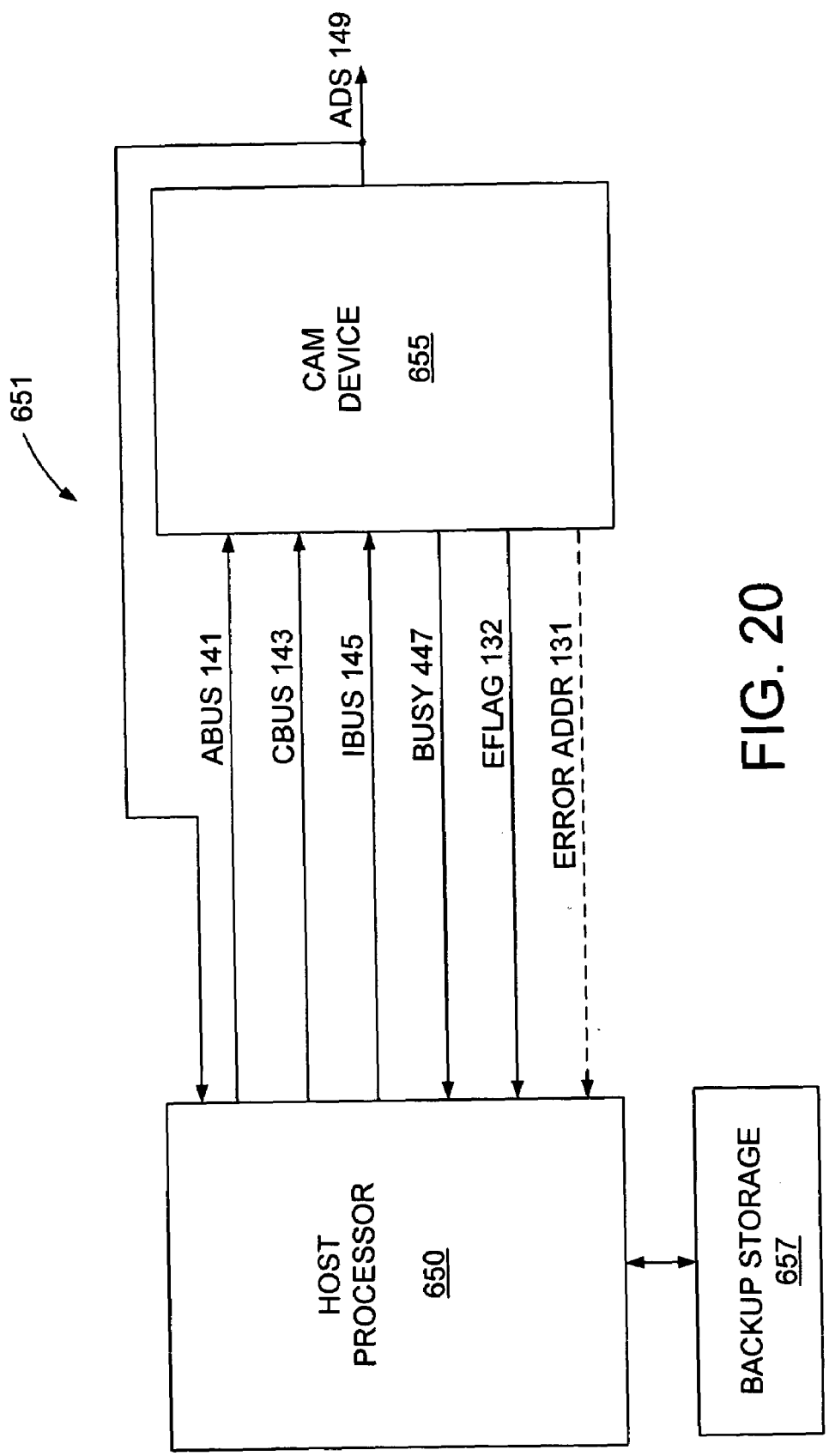
FIG. 20 illustrates a system device 651 that includes a host processor and CAM device according to an embodiment of the invention.

FIG. 20 illustrates a system device 651 that includes a host processor 650 (e.g., general purpose processor, digital signal processor, network processor, ASIC, etc.) and a CAM device 655 according to one of the embodiments described herein. The system device may be, for example, a network switch or router, or any other type of device in which the fast compare capability of the CAM device 655 may be useful.

The host processor 650 issues addresses, comparands, and instructions to the CAM device 655 via the address, comparand and instruction buses, respectively (i.e., ABUS 141, CBUS 143 and IBUS 145), and receives CAM indices and status information from the CAM device 655 via an address and status bus 149 (ADS). Though not shown in FIG. 20, the address and status bus 149 may additionally be coupled to supply CAM indices to an associated storage. The CAM indices may alternatively (or additionally) be output to the host processor 650 and/or the associated storage via a dedicated signaling path. Also, in alternative embodiments, one or more of the buses (e.g., ABUS, CBUS, IBUS, ADS) may be omitted and the corresponding information time multiplexed onto another of the buses. Further, the CAM device 655 and host processor 650 may be implemented in distinct integrated circuits (ICs) and packaged in distinct IC packages, or in a single IC (e.g., in an ASIC, system-on-chip, etc.), or in an IC package that includes multiple ICs (e.g., a multi-chip package, paper thin package, etc.).

Still referring to FIG. 20, the error flag signal 132 is preferably output from the CAM device 655 to the host processor 650 via a dedicated signal path (EFLAG), while the error address value 131 is preferably output from the CAM device 655 to the host processor 650 via the address and status bus 149. Alternatively, the error address 131 may be output to the host processor via a dedicated path as shown by the dashed line labeled ERROR ADDR in FIG. 20. Also, as discussed above, the error flag signal may alternatively (or additionally) be output to the host processor via the address and status bus 149. Further, a busy signal 447 may be output from the CAM device 655 to the host processor 650 to signal the host processor 650 that the CAM device 655 is busy performing a self-invalidation operation or self-correction operation as described above.

The host processor 650 is also coupled to a backup storage 657 which is used to store a backup copy of the CAM words stored in the CAM device 655. The backup storage 657 is preferably a non-volatile storage such as a battery-backed semiconductor storage, an electrically programmable read only memory (EPROM), a flash EPROM, or a magnetic or optical medium, but any type of data storage device may be used in alternative embodiments.

Figure 21:
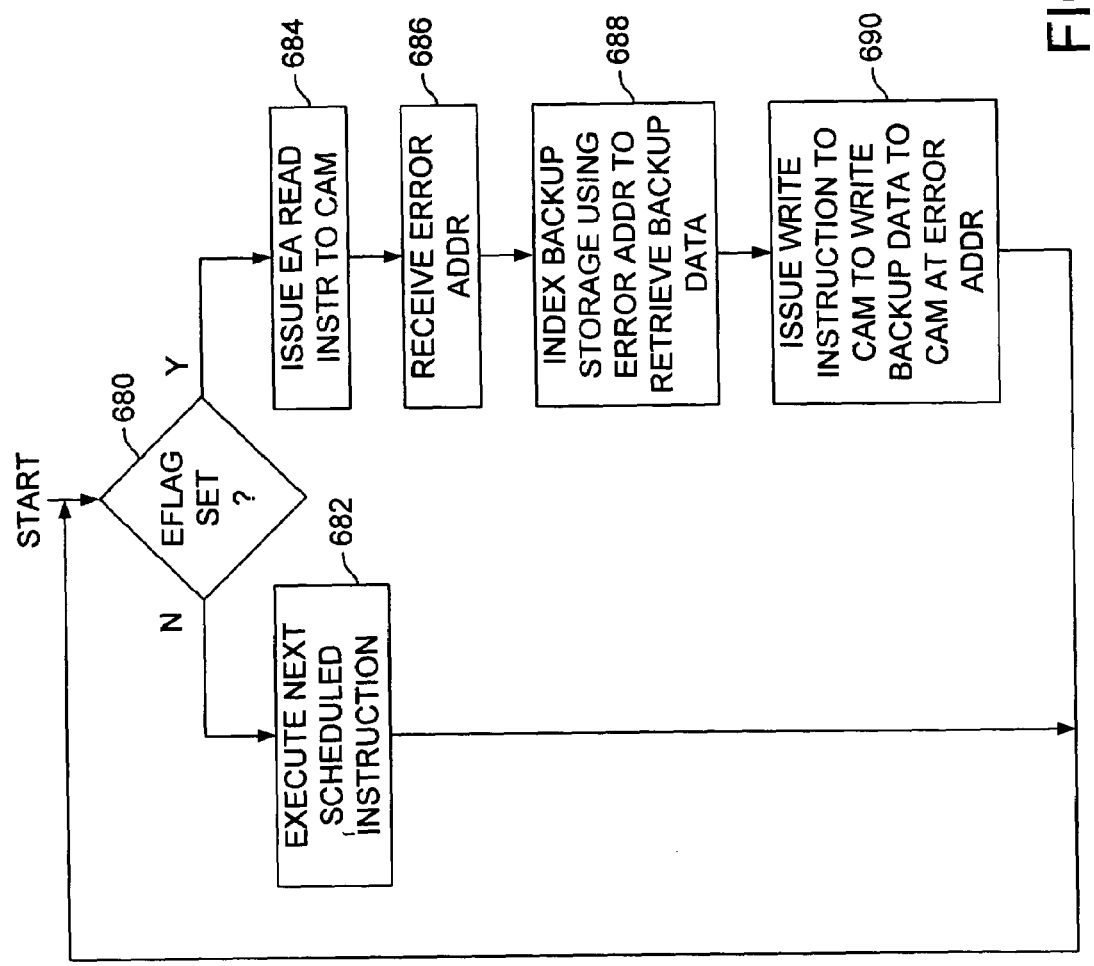
FIG. 21 illustrates the operation of the host processor of FIG. 20 according to one embodiment.

FIG. 21 illustrates the operation of the host processor of FIG. 20 according to one embodiment. Initially, at decision block 680, the host processor samples the error flag signal to determine whether the CAM device has detected an error in a CAM word. Sampling the error flag signal may involve, for example, sensing the error flag signal at a dedicated receiver of the host processor or issuing an instruction to the CAM device to output the error flag signal onto the address and status bus (or other signal line). If the error flag is not set, the host processor executes the next scheduled instruction, if any, in block 682. If the error flag is set, the host processor issues a instruction to the CAM device to output the error address (e.g., an "EA READ" instruction) in block 684. Some time later, at block 686, the host processor receives the error address from the CAM device, for example, via the address and status bus. At block 688, the host processor uses the error address to index (i.e., address) a backup storage device to retrieve backup data. After the backup data has been retrieved, the host processor issues an instruction to the CAM device at block 690 to write the backup data to the CAM array at the error address, thus overwriting the corrupted CAM word with an error free value.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A content addressable memory (CAM) device comprising:
   a CAM array;
   a first counter circuit coupled to the CAM array, the first counter circuit being adapted to store an address value and to incrementally adjust the address value in response to a first control signal and to reset the address value to a start address in response to a second control signal;
   a second counter circuit to store a limit value and to incrementally adjust the limit value in response to the second control signal; and
   a compare circuit coupled to receive the address value from the first counter circuit and the limit value from the second counter circuit, the compare circuit being adapted to assert the second control signal if the address value and the limit value have a predetermined relationship.

2. The CAM device of claim 1 wherein the compare circuit is adapted to compare the address value to the limit value and to assert the second control signal if the address value and the limit value are equal.

3. The CAM device of claim 1 wherein the second counter circuit is adapted to incrementally adjust the limit value in response to the second control signal after the second control signal has been delayed for a first delay time.

4. The CAM device of claim 1 wherein the first counter circuit is adapted to incrementally adjust the address value by increasing the address value by a predetermined amount.

5. The CAM device of claim 4 wherein the predetermined amount is one.

6. The CAM device of claim 1 wherein the first counter circuit is adapted to incrementally adjust the address value by decreasing the address value by a predetermined amount.

7. The CAM device of claim 1 wherein the start address corresponds to a highest priority storage location in the CAM array.

8. The CAM device of claim 1 wherein the start address is a lowest address that corresponds to a storage location within the CAM array.

9. The CAM device of claim 1 wherein the start address is a highest address that corresponds to a storage location within the CAM array.

10. The CAM device of claim 1 further comprising a programmable storage element to store the start address.

11. The CAM device of claim 1 wherein the second counter circuit is responsive to a third signal to reset the limit value to an initial limit value.

12. The CAM device of claim 11 wherein the initial limit value is an address value that corresponds to a highest priority storage location within the CAM array.

13. The CAM device of claim 11 wherein the initial limit value is a lowest address that corresponds to a storage location within the CAM array.

14. The CAM device of claim 11 wherein the initial limit value is a highest address that corresponds to a storage location within the CAM array.

15. The CAM device of claim 11 further comprising a storage element to store the initial limit value.

16. The CAM device of claim 15 wherein the storage element is programmable to store the initial limit value during operation of the CAM device.

17. The CAM device of claim 1 wherein the second counter circuit is adapted to incrementally adjust the limit value by increasing the limit value by a predetermined amount.

18. The CAM device of claim 1 wherein the second counter circuit is adapted to incrementally adjust the limit value by decreasing the limit value by a predetermined amount.

19. The CAM device of claim 1 further comprising a third counter circuit to store a block select value, the third counter circuit being adapted to incrementally adjust the block select value in response to a third control signal and to assert the first control signal when the block select value reaches a predetermined value.

20. The CAM device of claim 1 wherein the first counter circuit is adapted to detect when the limit value has reached a predetermined limit value and, in response, to generate a third control signal, the CAM device further comprising a third counter circuit to store a block select value, the third counter circuit being adapted to incrementally adjust the block select value in response to the third control signal.

21. The CAM device of claim 20 wherein the third counter circuit is further adapted to reset the block select value to an initial block select value in response to a fourth control signal, and the CAM device further comprising:
   a fourth counter circuit to store a block select limit and to incrementally adjust the block select limit in response to the fourth control signal; and
   a block select compare circuit coupled to receive the block select value from the third counter circuit and the block select limit from the fourth counter circuit, the block select compare circuit being adapted to assert the fourth control signal if the block select value and the block select limit have a predetermined relationship.

22. The CAM device of claim 1 wherein:
   the CAM array includes a plurality of rows of CAM cells and a plurality of word lines coupled respectively to the plurality of rows of CAM cells; and wherein the CAM device further comprises:
   an address decoder coupled to the plurality of word lines and coupled to receive the address value from the first counter circuit, the address decoder being adapted to activate one of the plurality of word lines according to the address value such that a data word within the row of CAM cells coupled to the one of the plurality of word lines is output from the CAM array; and
   an error detector coupled to receive the data word from the CAM array and having circuitry to determine whether the data word contains an error.

23. A content addressable memory (CAM) device comprising:
   means for accessing data stored at a first address value in a CAM array;
   means for comparing the first address value with a second address value to determine if the first address value and the second address value have a predetermined relationship; and
   means for incrementally adjusting the second address value if the first address value and the second address value have the predetermined relationship.

24. The CAM device of claim 23 further comprising means for resetting the first address value to a start address if the first address value and the second address value have the predetermined relationship.

25. The CAM device of claim 23 further comprising means for incrementally adjusting the first address value if the first address value and the second address value do not have the predetermined relationship.

26. The CAM device of claim 25 wherein the means for incrementally adjusting the first address value comprises means for increasing the first address value by a predetermined amount.

27. The CAM device of claim 25 wherein the means for incrementally adjusting the first address value comprises means for decreasing the first address value by a predetermined amount.

28. A content addressable memory (CAM) device comprising:
   a CAM array having a plurality of rows of CAM cells;
   a first counter to store an address for one of the rows of CAM cells;
   a second counter to store a limit value;
   a compare circuit coupled to the first and second counters to compare the address with the limit value; and
   an address decoder coupled to the first counter and the CAM array to select one of the rows of CAM cells corresponding to the address.

29. The CAM device of claim 28 further comprising an error detector coupled to the CAM array to receive a data word from the selected one the rows of CAM cells and to detect whether there is an error in the data word.

30. The CAM device of claim 28 wherein the CAM array comprises a plurality of CAM array blocks, and wherein the CAM device further comprises a third counter coupled to the first counter, the third counter to store a block select value to select one of the CAM array blocks.

31. The CAM device of claim 30 wherein the third counter is coupled to receive the address from the first counter.

32. The CAM device of claim 30 wherein the first counter is coupled to receive the block select value from the third counter.

33. The CAM device of claim 30 further comprising:
   a fourth counter to store a block select limit; and
   a second compare circuit coupled to the third and fourth counters to compare the block select value and the block select limit.

34. A method of operation within a content addressable memory (CAM) device, the method comprising:
   accessing data stored at a first address value in a CAM array;
   comparing the first address value with a second address value to determine if the first address value and the second address value have a predetermined relationship;
   incrementally adjusting the second address value if the first address value and the second address value have the predetermined relationship; and
   incrementally adjusting the first address value if the first address value and the second address value do not have the predetermined relationship.

35. The method of claim 34 further comprising resetting the first address value to a start address if the first address value and the second address value have the predetermined relationship.

36. The method of claim 35 wherein resetting the first address value to a start address comprises resetting the first address value to a start address that corresponds to a highest priority storage location in the CAM array.

37. The method of claim 35 wherein resetting the first address value to a start address comprises resetting the first address value to a lowest address that corresponds to a storage location within the CAM array.

38. The method of claim 35 wherein resetting the first address value to a start address comprises resetting the first address value to a highest address that corresponds to a storage location within the CAM array.

39. The method of claim 34 wherein incrementally adjusting the first address value comprises increasing the first address value by a predetermined amount.

40. The method of claim 34 wherein incrementally adjusting the first address value comprises decreasing the first address value by a predetermined amount.

41. The method of claim 34 wherein comparing the first address value with the second address value to determine if the first address value and the second address value have a predetermined relationship comprises determining if the first address value and the second address value are equal.

42. The method of claim 34 wherein comparing the first address value with the second address value to determine if the first address value and second address value have a predetermined relationship comprises determining if the first address value is greater than the second address value.

43. The method of claim 34 wherein incrementally adjusting the second address value comprises increasing the second address value by a predetermined amount.

44. The method of claim 34 wherein incrementally adjusting the second address value comprises decreasing the second address value by a predetermined amount.

45. The method of claim 34 further comprising:
receiving a reset signal; and
resetting the second address value to an initial value.

46. The method of claim 45 wherein resetting the second address value to an initial value comprises resetting the second address value to an initial value that corresponds to a highest priority storage location in the CAM array.

47. The method of claim 45 wherein resetting the second address value to an initial value comprises resetting the second address value to a lowest address that corresponds to a storage location within the CAM array.

48. The method of claim 45 wherein resetting the second address value to an initial value comprises resetting the second address value to a highest address that corresponds to a storage location within the CAM array.

* * * * *